United States Patent [19]
Ikuta et al.

[11] Patent Number: 5,781,627
[45] Date of Patent: Jul. 14, 1998

[54] SEMICONDUCTOR INTEGRATED CIRCUIT DEVICE WITH COPY-PREVENTIVE FUNCTION

[75] Inventors: Nobuo Ikuta; Kouji Ueno; Kouji Shishido; Yutaka Fukutani; Youji Arayama; Tomohiro Nakayama; Takanori Shiga; Masakazu Kimura; Hiroyuki Fujimoto; Yoshiyuki Fujita, all of Kawasaki, Japan

[73] Assignee: Fujitsu Limited, Kawaski, Japan

[21] Appl. No.: 509,641

[22] Filed: Jul. 31, 1995

[30] Foreign Application Priority Data

| Aug. 3, 1994 | [JP] | Japan | 6-182360 |
| Sep. 29, 1994 | [JP] | Japan | 6-234834 |
| Oct. 12, 1994 | [JP] | Japan | 6-246241 |
| Jan. 12, 1995 | [JP] | Japan | 7-003333 |
| Jul. 24, 1995 | [JP] | Japan | 7-187528 |

[51] Int. Cl.[6] ............................................. G11B 23/28
[52] U.S. Cl. ............................................. 380/3; 711/163
[58] Field of Search ................... 395/490; 380/4, 380/3; 365/184.04, 189.07

[56] References Cited

U.S. PATENT DOCUMENTS

| 5,056,009 | 10/1991 | Mizuta | 364/200 |
| 5,073,925 | 12/1991 | Nagata et al. | 380/3 |
| 5,131,091 | 7/1992 | Mizuta | 395/725 |
| 5,357,467 | 10/1994 | Hayashi | 365/189.05 |
| 5,406,519 | 4/1995 | Ha | 365/195 |
| 5,559,993 | 9/1996 | Elliot et al. | 395/490 |

OTHER PUBLICATIONS

"Semiconductor Memories", Betty Prince, 1992, pp. 118–122.

*Primary Examiner*—Joseph A. Popek
*Assistant Examiner*—Michael T. Tran
*Attorney, Agent, or Firm*—Nikaido, Marmelstein, Murray & Oram LLP

[57] ABSTRACT

A semiconductor integrated circuit device with a copy-preventive function comprises a memory for storing data to be used by users, an input unit for performing various logical operations on at least one input information fed externally and accessing the memory, an output unit for performing various logical operations on the data at the time of supplying the data from the memory, a judging unit for comparing at least one of the state of the input information, the logical state of the input unit, the logical state of the output unit, and the state of data provided by the output unit with specific judgment information and indicating the result of comparison, and a control unit that when the result indicated by the judging unit reveals that the at least one of the states is consistent with a specific state, acts at least on the output unit so as to prevent data stored in the memory from being supplied normally. Due to this configuration, a copy-preventive function can be reformed frequently from both the aspects of software and hardware. Consequently, illegal copying of data can be substantially disabled.

53 Claims, 37 Drawing Sheets

Fig. 5a

| TRANSISTOR | 31 | 32 | 33 | 34 | |
|---|---|---|---|---|---|
| STATE ① | E | D | D | E | DETECTION OF COINCIDENCE WHEN Ai="0" |
| STATE ② | D | E | E | D | DETECTION OF COINCIDENCE WHEN Ai="1" |
| STATE ③ | D | E | D | E | DETECTION OF COINCIDENCE WHEN Ai="0" OR "1" |

D : DEPLETION TYPE
E : ENHANCEMENT TYPE

Fig. 5b

| ADDRESS | A3 | A2 | A1 | A0 |
|---|---|---|---|---|
| "04" 「0100」 → | ① | ② | ① | ① |
| "11" 「1011」 → | ② | ① | ② | ② |
| "04" 「0100」<br>"05" 「0101」 → | ① | ② | ① | ③ |

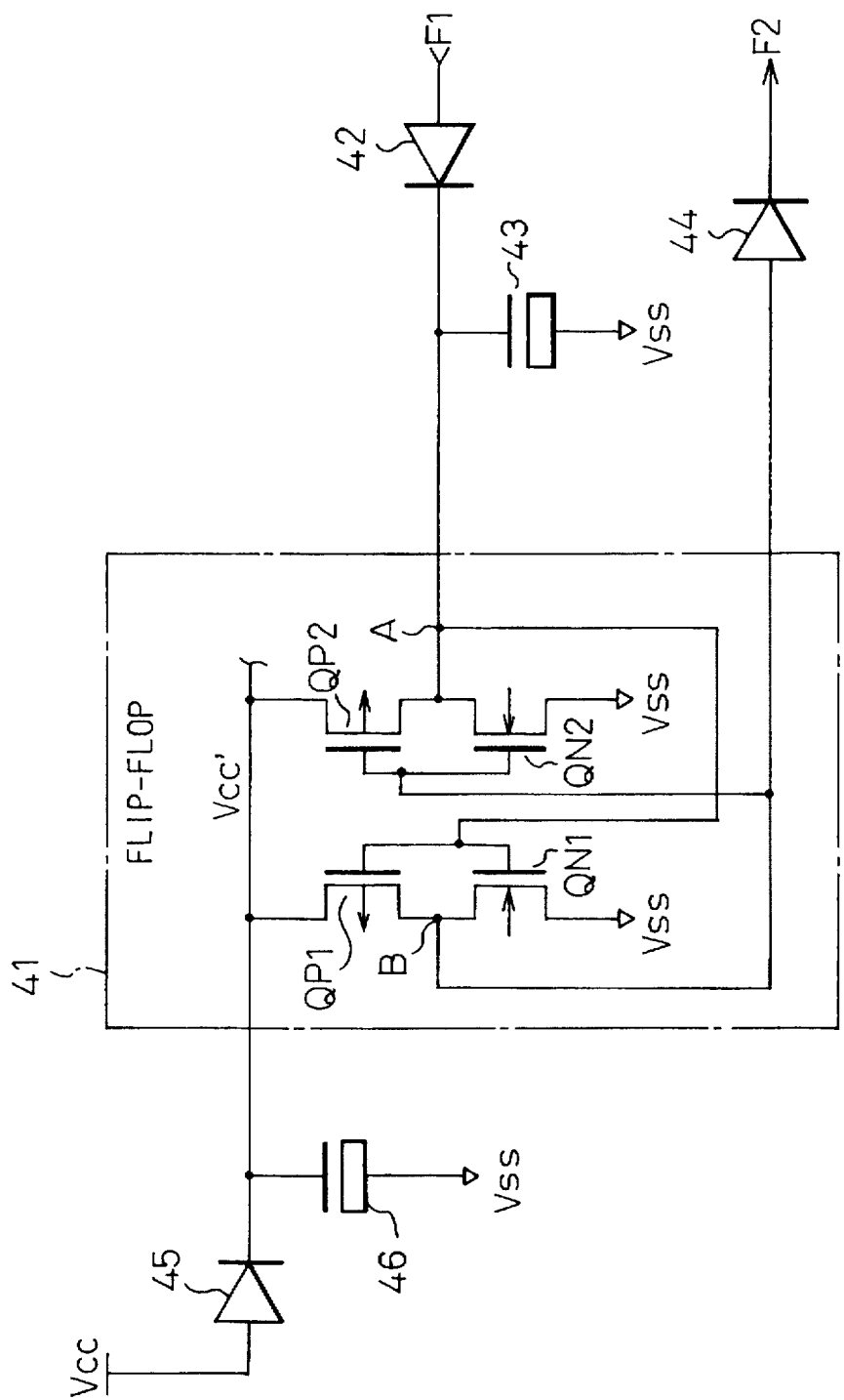

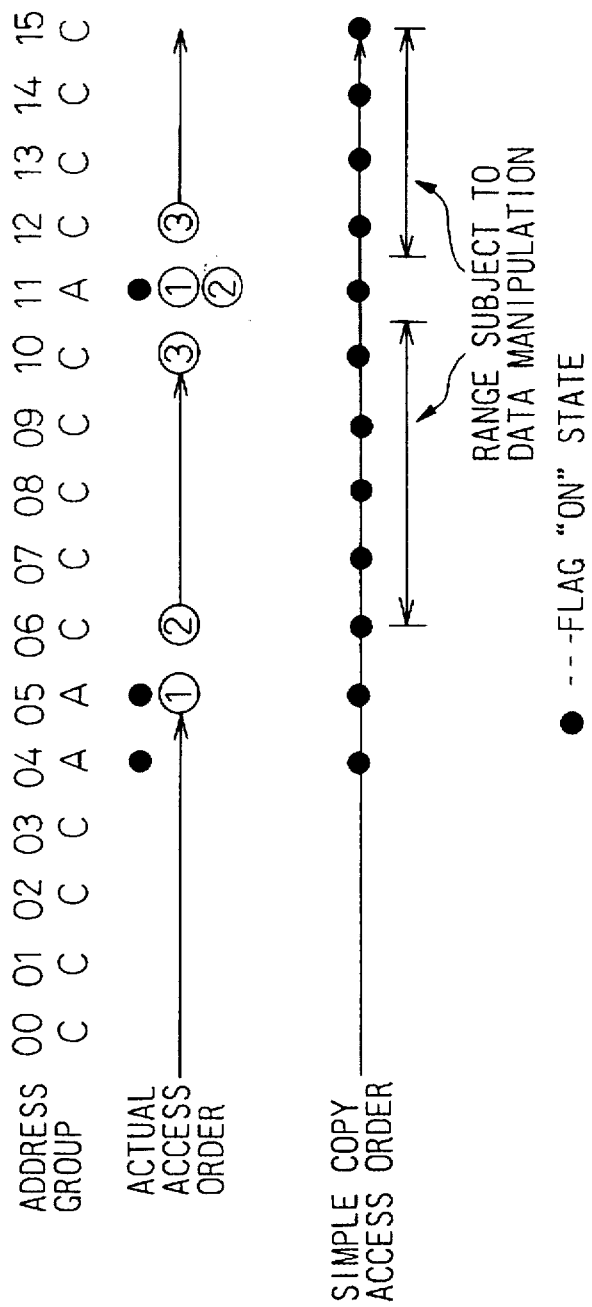

```
REGULAR OUTPUT SGL 0 1 0 0 1 1 0 1 0 0 1 0 1 0 1 0 1
       FLAG SGL 0 0 0 1 1 1 1 1 1 1 1 1 1 0 0 0 0
    OUTPUT VALUE 0 1 0 1 1 1 1 1 1 1 1 1 1 0 1 0 1
                       └─────────────────┘
                         RANGE OF OBJECT
```

```
REGULAR OUTPUT SGL 0 1 0 0 1 1 0 1 0 0 1 0 1 0 1 0 1
         FLAG SGL 0 0 0 1 1 1 1 1 1 1 1 1 1 0 0 0 0
      ADDRESS SGL 0 1 0 1 0 1 0 1 0 1 0 1 0 1 0 1 0
     OUTPUT VALUE 0 1 0 1 0 1 0 1 0 1 0 1 0 0 0 1 0 1
```

RANGE OF OBJECT

```
REGULAR OUTPUT SGL 1  0 1 0 0 1 1 0 1 0 0 1 0 1 0 1 0 1
REGULAR OUTPUT SGL 2  1 1 0 1 1 1 0 0 0 0 1 1 1 1 1 0 0
        FLAG SGL      0 0 0 1 1 1 1 1 1 1 1 1 1 0 0 0 0
     OUTPUT VALUE 1   0 1 0 1 1 1 0 0 0 0 1 1 1 0 1 0 1
     OUTPUT VALUE 2   1 1 0 0 1 1 0 1 0 0 1 0 1 1 1 0 0
```

RANGE OF OBJECT

SEMICONDUCTOR INTEGRATED CIRCUIT DEVICE WITH COPY-PREVENTIVE FUNCTION

BACKGROUND OF THE INVENTION

1. Field of the Invention

The present invention relates to a semiconductor integrated circuit device and, more particularly, to a read-only memory (ROM) having a copy-preventive function.

2. Description of the Related Art

Among ROMs, a masked ROM, in which data to be placed in the ROM is fixed using a mask during wafer fabrication for forming a semiconductor integrated circuit, is commonly adapted to game equipment or office automation (OA) equipment. However, the data residing in a ROM or ROM data is not protected and is sometimes copied illegally. A system for preventing illegal copying must be installed in a masked ROM device. In this case, it is necessary to improve the ability to prevent illegal copy. On the other hand, consideration must be taken into minimizing the manufacturing cost of the device. Preferably, the device can be manufactured by following ordinary processes.

It is disclosed in, for example, Japanese Unexamined Patent Publications Nos. 63-225839, 61-265649, and 1-173244 are arts relating to ROM copy prevention. To begin with, according to the art disclosed in the Japanese Unexamined Patent Publication No. 63-225839 (Refer to the eighteenth line in the left column to the third line in the right column in page 1), a copy-preventive function is realized by setting a specific key pattern in a circuit. It is then determined whether a newly entered key pattern is consistent or inconsistent with the specific key pattern. According to the art disclosed in the Japanese Unexamined Patent Publication No. 61-265649 (Refer to the fifteenth line in the left column to the sixth line in the right column in page 1), the copy-preventive function is realized using an inexpensive means such as a ROM writer. According to the art disclosed in the Japanese Unexamined Patent Publication No. 1-173244 (Refer to the nineteenth line in the right column in page 1 to the sixth line in the left upper column in page 2), the copy-preventive function is realized by comparing an access order of specific addresses with a predetermined access order written in software. The underlying idea is that when a system is constructed using a ROM code, once the ROM code is stolen, ROM data is copied easily thereafter (Refer to the eighth line to the eleventh line in the right column in page 1).

The art described in the Japanese Unexamined Patent Publication No. 63-225839 makes it necessary to define a special mode (random pattern) for use permission (Refer to the eighth to eleventh lines in the right lower column in page 2). This leads to complex circuitry and increased cost. A memory whose data can be compared for judgment is limited to a nonvolatile memory (Refer to the ninetieth to twentieth lines in the right lower column in page 2). This becomes an obstacle to circuit design. Furthermore, since another memory area must be defined for a key pattern, if the memory area is electrically accessed in the form of a chip, the key pattern can be obtained readily (that is, the key pattern may be copied). When a key pattern is a combination of simple numerals, it would not take much time to try all conceivable combinations of numerals in finding the key pattern. This is because hardware has come to offer high performance and is widely available. Thus, the key pattern may be interpreted relatively effortlessly. As for a ROM whose key pattern has once been interpreted, since scrambling is removed, copy prevention remains invalidated. The actual effect of copy prevention is exerted only in an initial stage.

The art described in the Japanese Unexamined Patent Publication No. 61-265649 attempts to protect data by holding a CE terminal in a timer circuit (Refer to the seventeenth line in the right upper column to the fourth line in the left lower column in page 2, and the twentieth line to the nineteenth line in the right lower column in page 2). In this case, an operating address in the timer circuit is found rather easily. Copy prevention is therefore released relatively quickly. Practically, this art cannot realize a perfect copy-preventive function.

According to a art disclosed in the Japanese Unexamined Patent Publication No. 1-173244, the access order of specific addresses is limited to access orders pre-defined in software. Copy prevention may therefore be ineffective for a large amount of data. Since access orders are defined in software, restraints are imposed on development of the software. The development work is complicated and the software becomes relatively complex. In principle, when a routine for running software is interpreted, interpreted information is obtained. Therefore, when an attempt is made to read software normally, the software can be copied by analyzing thus-obtained interpreted information carefully. Since access orders are defined, a special test must be conducted as part of delivery or acceptance tests. This is because a simple orderly-access test may cause a copy-preventive function to operate.

As mentioned above, the known arts provide the fundamental ideas for copy prevention. The arts attempt to realize a ROM copy-preventive function using software or hardware. All of the arts do not make it possible to reform the copy-preventive function. For a person trying to copy data illegally, it is worth while taking much time for analysis. Anyhow, data can be stolen relatively easily.

In other words, the conventional copy-preventive function is not realized from both aspects of software and hardware. In practice, ROM data cannot be protected from being stolen but is easily available. That is to say, when the copy-preventive function is implemented in a semiconductor integrated circuit, an effective means must be realized without the need of restraining software, or including an extra circuit in the semiconductor integrated circuit, or defining an extra manufacturing process.

The requirements for a copy-preventive function in compliance with the aforesaid problems in the prior art will be listed below.

First requirement: no restraints must be imposed on software. After software is developed, a wide trap area in which a copy-preventive function is active can be specified at a step in the software.

Second requirement: a copy-preventive function should not be actuated at the time of delivery inspection conducted by a manufacturer of a semiconductor integrated circuit or at the time of acceptance inspection conducted by a customer whose places an order. Alternatively, if the copy-preventive function should be actuated, copy prevention must be released readily. (However, this contradicts the object of the copy-preventive function.)

Third requirement: when hardware is analyzed by directly changing internal electrical connection of a semiconductor integrated circuit or by analyzing electric signals, the feasibility of copy resulting from the analysis should be minimized. That is to say, since it is now possible to manipulate the internal electrical connection of a chip, any technology analysis technique enables ready invalidation of a copy-preventive function in the integrated circuit. The risk should be minimized.

SUMMARY OF THE INVENTION

An object of the present invention is to provide a semiconductor integrated circuit device with a copy-preventive function making it possible to frequently reform the copy-preventive function from both aspects of software and hardware and to substantially disable illegal copying of data.

According to a first aspect of the present invention, as shown in FIG. 1, there is provided a semiconductor integrated circuit device with a copy-preventive function comprising a memorizing unit 1 for storing data to be used by users, an inputting unit 2 for performing various logical operations on at least one input information fed externally and accessing said memorizing unit, an outputting unit 3 for performing various logical operations on said data at the time of supplying said data from said memorizing unit, a judging unit 4 for comparing at least one of the state of said input information, the logical state of said inputting unit, the logical state of said outputting unit, and the state of data provided by said outputting unit with specific judgment information and for indicating the result of comparison, and a controlling unit 5 that when said result indicated by said judging unit demonstrates that at least one of said states is consistent with said specific state, acts on said outputting unit so as to prevent data stored in said memorizing unit from being supplied normally.

A preferred embodiment of the semiconductor integrated circuit device in accordance with the present invention is realized as a mask ROM (that is a read-only memory in which data to be used by users is fixed in a memorizing means during wafer fabrication for forming a semiconductor integrated circuit).

In this case, respective functions of said judging unit and controlling unit may be varied by the same process as that for fixing data in a memorizing unit through wafer fabrication for forming a semiconductor integrated circuit; that is, ion implantation or electrical connection.

A holding unit may be included in order to hold a judgment of said judging unit 4 meaning that at least one of said states is consistent with said specific state.

According to a second aspect of the present invention, as shown in FIG. 2, there is provided a semiconductor integrated circuit device with a copy-preventive function comprising a memorizing unit 1 for storing data to be used by users, an inputting unit 2 for performing various logical operations on at least one input information fed externally and accessing said memorizing unit, an outputting unit 3 for performing various logical operations on said data at the time of supplying said data from said memorizing unit, a detecting/memorizing unit 6 for referencing information concerning a plurality of specific address regions containing addresses associated with data items existent in said memorizing unit, detecting which of said plurality of specific address regions is accessed in response to said input information, and storing the access situation, and a data manipulating unit 7 for checking the stored access situation for condition judgment, and controlling said outputting unit to manipulate the contents of data to be supplied from said memorizing unit.

In a preferred embodiment of the present invention, said detecting/memorizing unit detects and stores the number of consecutive accesses gained to a specific one of said plurality of specific address regions in response to said input information. In this case, said data manipulating unit controls so as to manipulate the contents of output data according to the result of condition judgment that is the stored number of accesses.

In this case, said data manipulating unit may control so as to manipulate the contents of output data according to whether the number of accesses gained to a specific area, which is stored in said detecting/memorizing unit, is even or odd.

In the configuration according to the first aspect of the present invention, when the judging unit 4 judges that at least one of the states (the state of input information, the logical state of the inputting unit, the logical state of the outputting unit, or the state of data supplied from the outputting unit) is consistent with a specific state, the controlling unit 5 acts at least on the outputting unit 3 so as to prevent data stored in said memorizing unit 1 from being supplied normally. Thus, illegal copying of data can be substantially disabled.

When a semiconductor integrated circuit device in accordance with the present invention is realized as a masked ROM, a facility (that is a copy-preventive function) realized by the judging unit 4 and controlling means 5 can be modified from both the aspects of software and hardware using the same means as that for fixing data in a memorizing unit through wafer fabrication for forming a semiconductor integrated circuit (for example, ion implantation or electrical connection). This cripples analysis of data, thus discouraging a person contemplating illegal copying of data.

When a means for holding a judgment of the judging unit 4, meaning that at least one of said states is consistent with the specific state (for example, information indicating whether or not illegal copy has been attempted), is included, it is possible to discourage a person contemplating illegal copying of data from proceeding to analysis or causing the person to waste much time on analysis. This makes illegal copying of data difficult or substantially unfeasible.

In the configuration according to the second aspect of the present invention, the detecting/memorizing unit 6 detects which of the plurality of specific address regions is accessed in response to input information and stores the access situation. Using the stored access situation for condition judgment, the data manipulating unit 7 controls at least the outputting unit 3 so as to manipulate the contents of data supplied from the memorizing unit 1. This substantially disables illegal copying of data.

BRIEF DESCRIPTION OF THE DRAWINGS

Other objects and features of the present invention will be described in detail in conjunction with preferred embodiments and with reference to the appended drawings.

FIGS. 5a and 5b are explanatory diagrams concerning the use form of the circuitry shown in FIG. 4;

FIG. 6 is a circuit diagram showing an example of circuitry of a flag circuit shown in FIG. 3;

FIG. 12 is an explanatory diagram concerning the second example of copy prevention in accordance with the second embodiment;

DESCRIPTION OF THE PREFERRED EMBODIMENTS

Figure 3:
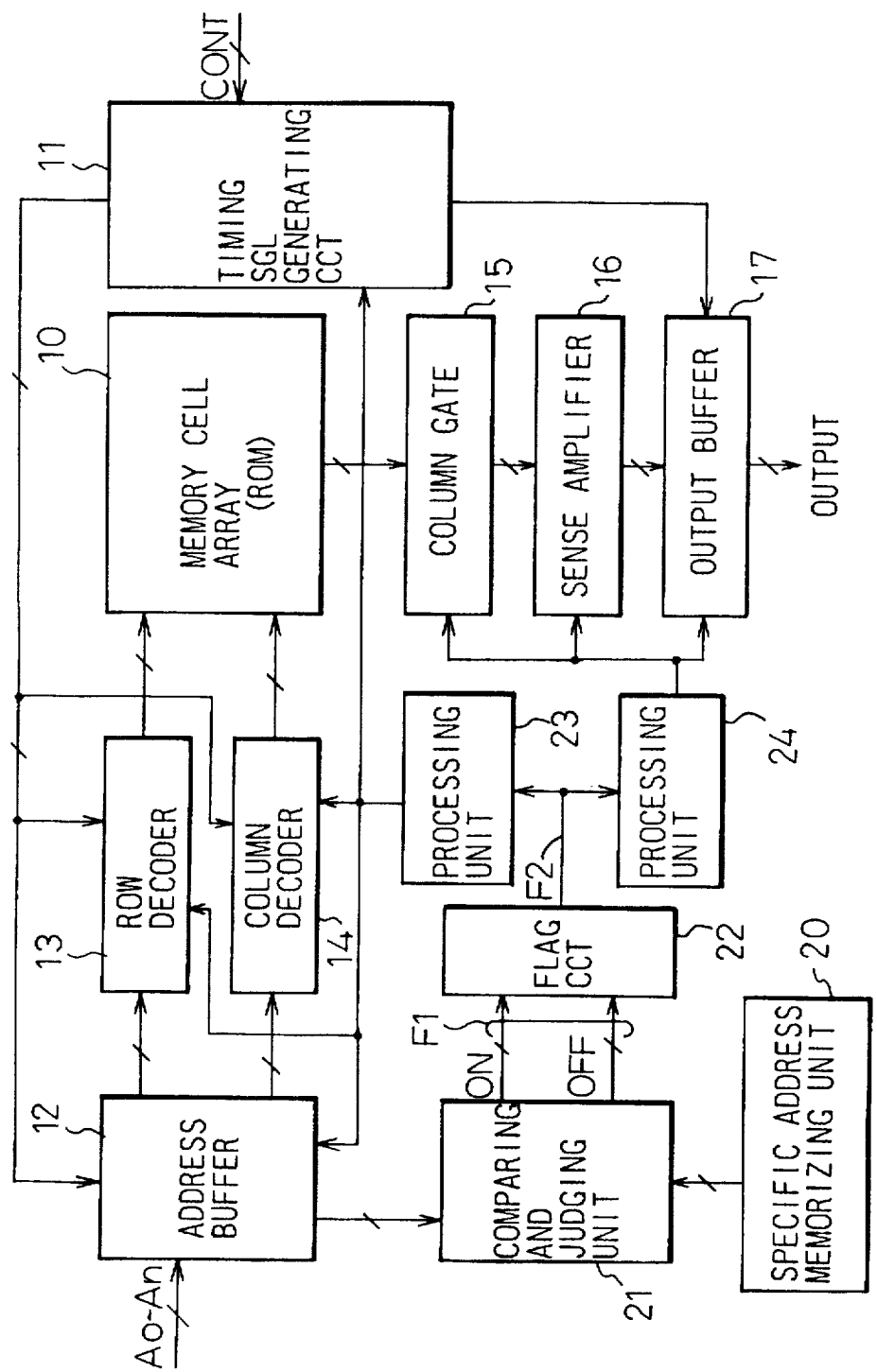
FIG. 3 is a block diagram schematically showing the configuration of a ROM device with a copy-preventive function in accordance with the first embodiment of the present invention.

FIG. 3 schematically shows the configuration of a ROM device with a copy-preventive function in accordance with the first embodiment of the present invention.

In FIG. 3, reference numeral 10 denotes a memory cell array in which ROM cells are installed at intersections between a plurality of word lines and a plurality of bit lines (not shown). 11 denotes a timing signal generating circuit for generating various timing signals for use in controlling the timing of acquiring input information and the timing of supplying output data on the basis of a control signal CONT sent externally. 12 denotes an address buffer for buffering a multi-bit address signal A0-An. 13 denotes a row decoder for selecting any of the plurality of word lines in the memory cell array 10 according to a row address signal consisting of a plurality of high-order bits of the address signal A0-An. 14 denotes a column decoder for selecting any of the plurality of bit lines in the memory cell array 10 according to a column address signal consisting of a plurality of low-order bits of the address signal A0-An. 15 denotes a column gate for linking a selected bit line to an associated data line. 16 denotes a sense amplifier for sensing and amplifying data on a data line. 17 denotes an output buffer for externally outputting data that has been sensed and amplified.

The above components are circuit elements incorporated in a typical ROM. Circuit elements 20 to 24 described below dominate the features of the present invention.

Reference numeral 20 denotes a specific address memorizing unit in which a specific address is pre-set as judgment information. 21 denotes a comparing and judging unit for comparing an input address signal A0-An with the specific address and outputting a result of comparison; that is, consistency or inconsistency as a judgment F1 by providing flag information or turning on or off an appended flag. 22 denotes a flag circuit for retaining the judgment F1 provided by the comparing and judging unit 21. 23 denotes a processing unit for manipulating or modifying the state of input information or a logical state for the sake of an inputting means (consisting of the circuit elements 11 to 14) according to the information (control flag output signal F2) retained by the flag circuit 22.

Figure 4:
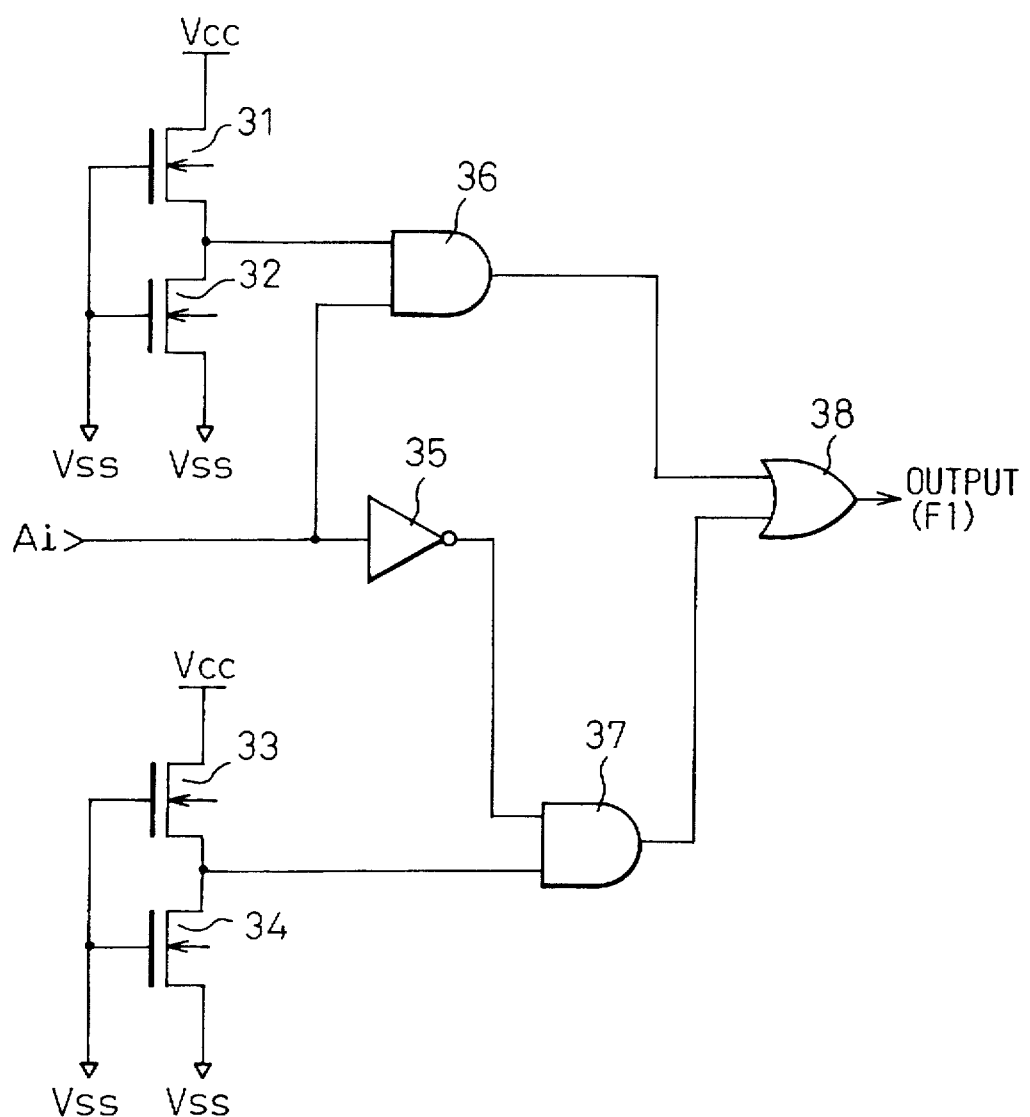
FIG. 4 is a circuit diagram showing an example of circuitry of a comparing and judging unit and a specific address memorizing unit.

FIG. 4 shows an example of circuitry of the comparing and judging unit 21 and specific address memorizing unit 20. FIGS. 5a and 5b show an example of the use form of the circuitry.

To begin with, the circuitry shown in FIG. 4 consists of two n-channel transistors 31 and 32 that are connected in series with each other between a high-potential power line Vcc (for example, 5 V) and a low-potential power line Vss (for example, 0 V) and are responsive to the potential at the power line Vss, two n-channel transistors 33 and 34 that are connected in series with each other between the power lines Vcc and Vss and are responsive to the potential at the power line Vss, an inverter 35 responsive to an (one-bit) address signal Ai sent externally, an AND gate 36 responsive to the drain voltage of the transistor 32 (source voltage of the transistor 31) and the address signal Ai, an AND gate 37 responsive to the drain voltage of the transistor 34 (source voltage of the transistor 33) and the output of the inverter 35, and an OR gate 38 responsive to the outputs of the AND gates 36 and 37.

The circuitry shown in FIG. 4 is an arrangement responsive to any one bit Ai of the address signal A0-An. In reality, the circuitry is sized by the number of address bits; that is, n+1. In the illustrated circuitry, the transistors 31 to 34 correspond to the specific address memorizing unit 20 and the other circuit elements 35 to 38 correspond to the comparing and judging unit 21.

In the foregoing circuitry, a specific address can be determined by setting the transistors 31 to 34 to the depletion mode or to the enhancement mode usually adopted. The depletion mode is realized by implanting ion atoms such as arsenic (As) or phosphorous (P) in a channel region of an n-channel transistor.

FIG. 5a shows an example of setting the operation modes of the transistors 31 to 34.

As illustrated, when the transistors 32 and 33 are of the depletion type and the transistors 31 and 34 are of the enhancement type, state (1) can be realized. In the state (1), when the input address bit Ai is a 0, the AND gate 37 is validated. Supply voltage Vcc (that is, a 1) is therefore supplied through the depletion-type transistor 33 by way of the AND gate 37 and OR gate 38. In other words, when the input address bit Ai is a 0, consistency with the specific address "1" is detected (the judgment F1 is provided by turning on an appended flag).

When the transistors 31 and 34 are of the depletion type and the transistors 32 and 33 are of the enhancement type, state (2) is realized. In the state (2), when the input address bit Ai is a 1, the AND gate 36 is validated. The supply voltage Vcc (that is, "1") is supplied through the depletion-type transistor 31 by way of the AND gate 36 and OR gate 38. In other words, when the input address bit Ai is a 1, consistency with the specific address "1" is detected (the judgment F1 is provided by turning on the appended flag).

When the transistors 31 and 33 are of the depletion type and the transistors 32 and 34 are of the enhancement type, state (3) is realized. In the state (3), when the input address bit Ai is a 0 or 1, the AND gate 37 or 36 is validated. The supply voltage Vcc (that is, "1") is supplied through the depletion-type transistor 33 or 31 by way of the AND gate 37 or 36 and OR gate 38. In other words, when the input address bit Ai is a 0 or 1, consistency with the specific address "1" is detected (the judgment F1 is provided by turning on the appended flag).

FIG. 5b shows an example of setting a specific address.

For setting an address 04 or 0100, the transistors 31 to 34 in each of circuitries (See FIG. 4) associated with four address bits A3, A2, A1, and A0 should be formed as depletion-type or enhancement-type transistors so that the circuitries will be placed in states (1), (2), (1), and (1) respectively. Likewise, for setting an address 11 or 1011, the transistors 31 to 34 in each of the circuitries associated with the four address bits A3, A2, A1, and A0 should be formed as depletion-type or enhancement-type transistors so that the circuitries will be placed in states (2), (1), (2), and (2) respectively.

For setting two addresses 04 or 0100 and 05 or 0101, the transistors 31 to 34 in each of the circuitries (See FIG. 4) associated with the four address bits A3, A2, A1, and A0 should be formed as depletion-type or enhancement-type transistors so that the circuitries will be placed in states (1), (2), (1), and (3) respectively. In this case, the two addresses are specified in one address region.

In the circuitry shown in FIG. 4, the specific address (or specific address region) is determined by setting the transistors to the depletion mode instead of to the depletion mode. Aluminum or any other metallic lines or polysilicon lines may be employed. The circuitry shown in FIG. 4 includes transistor elements and gate elements. Alternatively, fuse elements, and ROMs and RAMs may be employed. For example, when fuse elements are used in place of the transistors, a specific address is determined in the stage of a probing test (PT).

FIG. 6 shows an example of circuitry of the flag circuit 22.

In FIG. 6, reference numeral 41 denotes a flip-flop also called a bistable multivibrator having input/output nodes A and B. The flip-flop 41 is composed of a p-channel transistor QP1 and n-channel transistor QN1 connected in series with each other between an internal power line Vcc' and a low-potential power line Vss and made into a CMOS responsive to the potential at the input/output node A, and a p-channel transistor QP2 and n-channel transistor QN2 connected in series with each other between the internal power line Vcc' and power line Vss and made into a CMOS responsive to the potential at the input/output node B. The output terminal of the CMOS consisting of the transistors QP1 and QN1 is connected to the input/output node B, while the output terminal of the CMOS consisting of the transistors QP2 and QN2 is connected to the input/output node A.

Figure 1:
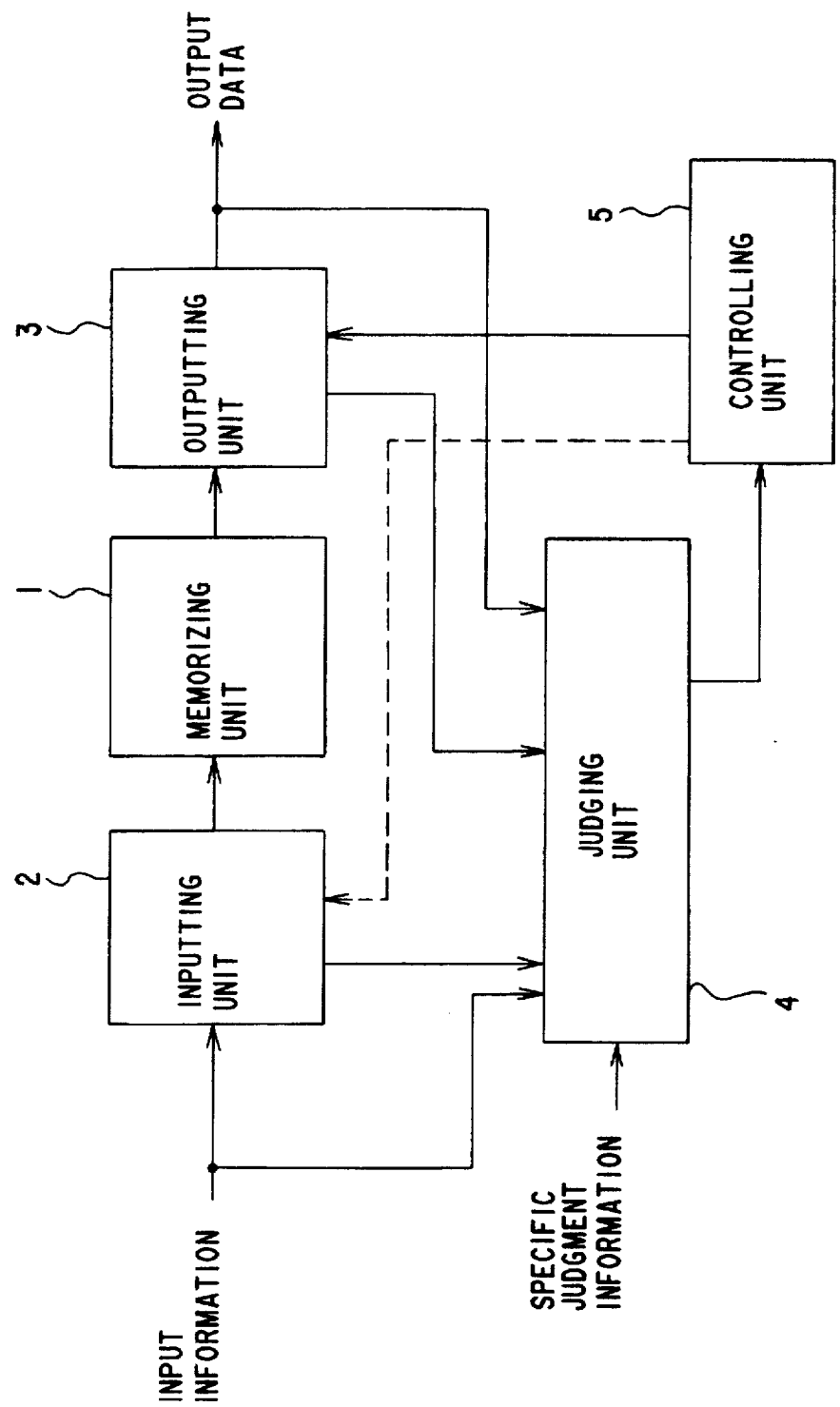
FIG. 1 shows the principle and configuration of a semiconductor integrated circuit device with a copy-preventive function according to the first aspect of the present invention.
Figure 2:
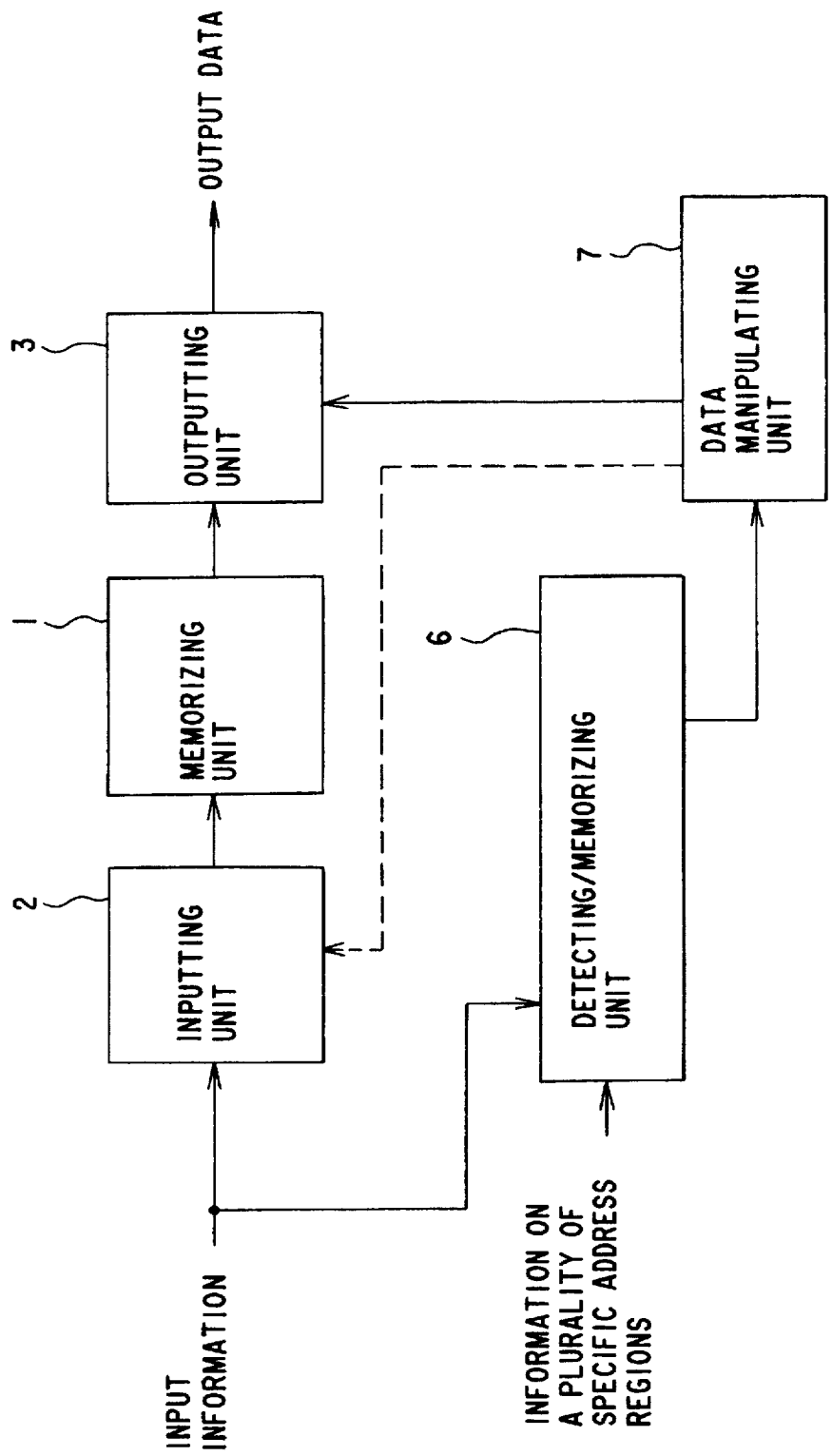
FIG. 2 shows the principle and configuration of a semiconductor integrated circuit device with a copy-preventive function according to the second aspect of the present invention.

Reference numeral 42 denotes a diode for conveying the judgment F1 provided by the comparing and judging unit to the node A of the flip-flop 41. 43 denotes a capacitor interposed between the output terminal of the diode 42 and the power line Vss. 44 denotes a diode for transmitting a signal developed at the node B of the flip-flop 41 as a control flag output signal F2 to the processing units 23 and 24 (See FIG. 2). 45 denotes a diode for transmitting supply voltage Vcc to be applied to the ROM device of this embodiment over the internal power line Vcc' of the flip-flop 41. 46 denotes a capacitor interposed between the output terminal of the diode 45 and the power line Vss.

The capacitors 43 and 46 are MOS capacitors produced through wafer fabrication for forming a semiconductor integrated circuit. The process is realized using a means generally known by any person with ordinary skill in the art. No mention will therefore be made of the process.

According to the circuitry shown in FIG. 6, the judgment F1 provided by the comparing and judging unit is retained at the node A of the flip-flop 41 via the diode 42. A signal whose logic level is opposite to that of the information retained at the node A is provided as a control flag output signal F2 from the node B via the diode 44.

The capacitor 43 is connected to the node A alone of the flip-flop 41. With power on, the state of the flip-flop 41 (logical states at the nodes A and B) can be determined uniquely and stably. For normal operation, data can be read correctly with power on.

Since the capacitor 46 is connected on the internal power line Vcc', even if the supply voltage Vcc is broken, data latched in the flip-flop 41 can be held intact for a given period of time after the power is turned off because of the charge stored in the capacitor 46.

In the circuitry shown in FIG. 6, a bistable multivibrator (flip-flop 41) is used as a means for retaining the judgment F1 provided by the comparing and judging unit. The holding means is not limited to the bistable multivibrator. Alternatively, an irreversible element whose state cannot be returned to the original one; such as, a fuse element, or a reversible element whose state can be returned to the original one using some means; such as, an EPROM or EEPROM will do.

In the circuitry shown in FIG. 6, the diodes 42, 44, and 45 are included. Alternatively, elements having an equivalent rectification ability, for example, normal MOSs will do.

Figure 7:
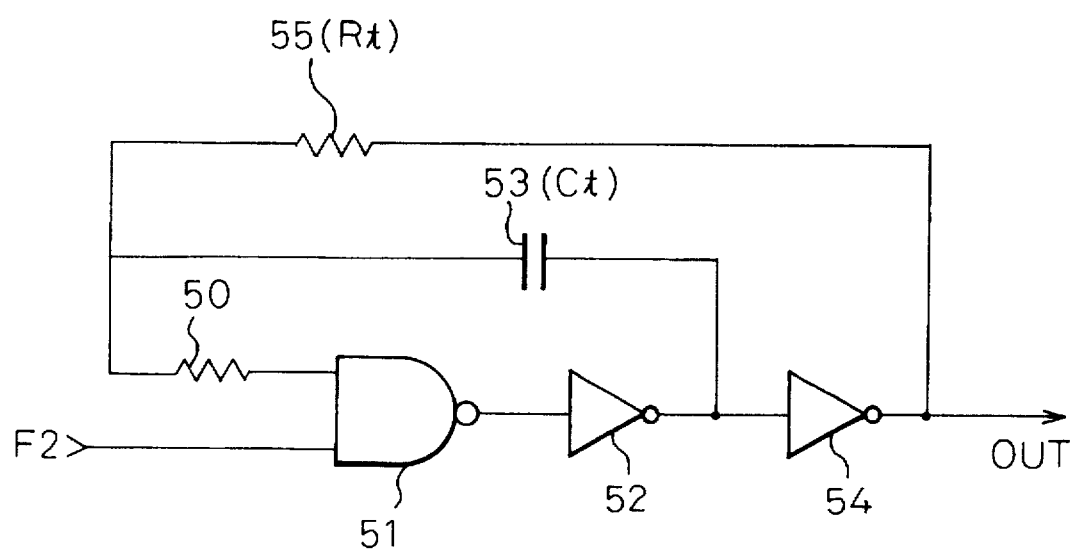
FIG. 7 is a circuit diagram showing an example of circuitry of a processing unit for an outputting means shown in FIG. 3.

FIG. 7 shows an example of circuitry of the processing unit 24 for an outputting means.

The illustrated circuitry is an arrangement of a CR oscillator. The circuitry includes a resistor 50, a NAND gate 51 that inputs a signal through one input terminal thereof via the resistor 50 and inputs the control flag output signal F2 through the other input terminal thereof, an inverter 52 responsive to the output of the NAND gate, a capacitor 53 (whose capacitance is Ct) for feeding back the output of the inverter to the resistor 50, an inverter 54 responsive to the output of the inverter 52, and a resistor 55 (whose resistance is Rt) for feeding back the output of the inverter to the resistor 50. The frequency of an oscillatory signal fed through the output terminal OUT of the inverter 54 is determined with the Ct and Rt values.

When an oscillator having the foregoing circuitry is incorporated in the processing unit 24, oscillation is started with the input of the judgment F1 (signal with a flag on) provided by the comparing and judging unit 21 to the oscillator via the flag circuit 22 (signal F2 with a flag on). This causes noise in the power supply system in the integrated circuit. The processing unit 24 then acts on the outputting means composed of the circuit elements 15 to 17 so as to destabilize the read-out of the ROM data from the memory cell array 10. That is to say, illegal copying of data is substantially disabled.

Figure 8:
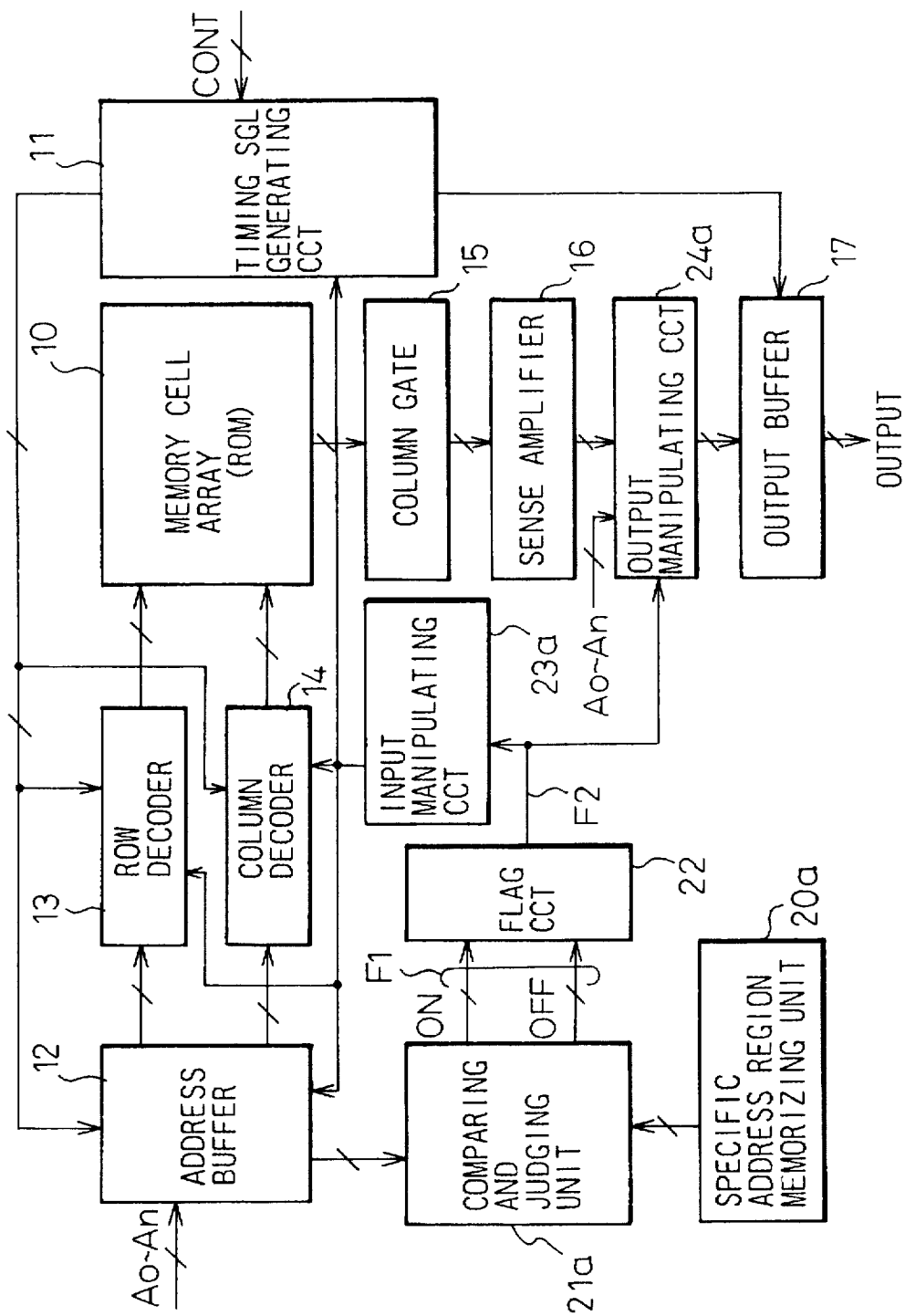
FIG. 8 is a block diagram schematically showing the configuration of a ROM device with a copy-preventive function in accordance with the second embodiment of the present invention.

FIG. 8 schematically shows the configuration of a ROM device with a copy-preventive function in accordance with the second embodiment of the present invention.

Differences from the configuration of the first embodiment (See FIG. 3) are (1) that a specific address region memorizing unit 20a for storing information concerning a plurality of specific address regions containing addresses associated with data items existent in the memory cell array 10 is installed in place of the specific address memorizing unit 20, (2) that a comparing and judging unit 21a having the same ability as the comparing and judging unit 21 is installed in place of the comparing and judging unit 21, and (3) that an input manipulating circuit 23a and output manipulating circuit 24a having the same abilities as the processing units 23 and 24 are installed in place of the processing units 23 and 24.

The comparing and judging unit 21a compares input information (address signal A0-An) with information concerning the plurality of specific address regions, detects which specific address region is accessed, and checks the access situation for condition judgment (for example, the number of accesses and the access order). The resultant judgment is provided as a judgment F1 by providing flag information (by turning on or off an appended flag). The output manipulating circuit 24 in this embodiment is interposed between the sense amplifier 16 and output buffer 17, and manipulates the contents of output data according to the information (control flag output signal F2) retained in the flag circuit 22 and the address signal A0-An. In other words, the output manipulating circuit 24a manipulates the logical state of output data so that the data will be different from the correct data to be supplied or destroys the output data itself as described later.

Referring to FIGS. 9 to 17, a practical example of copy prevention will be described below.

(1) Means for meeting the aforesaid first requirement for the prior art

Normally, software is composed of a main program division and a sub-program division, a program division and data division, or independent data blocks. Thus, data is allocated to address regions. In this case, each address region can be divided into sub-regions. The sub-regions need not be mutually continuous.

Figure 9:
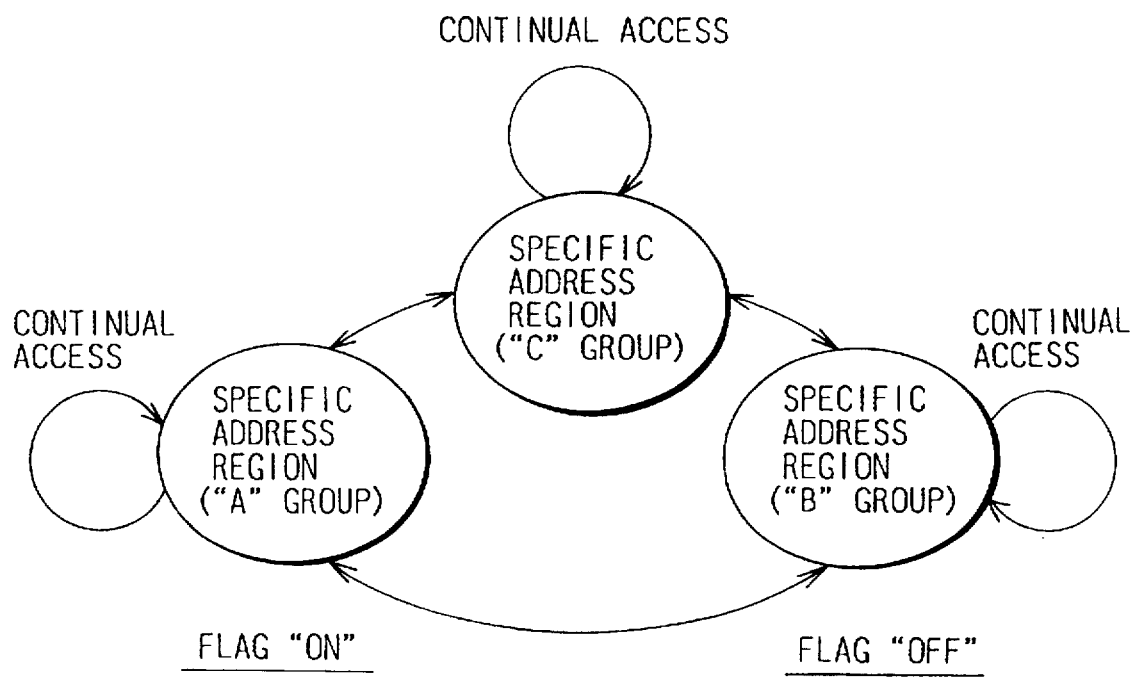
FIG. 9 shows the relationships among accesses gained to specific address regions and on and off states of flags in accordance with the second embodiment.

In this embodiment, as in an example shown in FIG. 9, addresses of data are divided into groups associated with a plurality of specific address regions (groups A, B, and C associated with three regions in the illustrated example). The comparing and judging unit 21 detects which specific address region is designated by the input information (address signal A0-An) (in other words, which specific address region is accessed). When a specific address region is designated, data is retrieved with a flag turned on. When the specified address region is not designated by the input address or when the designation is released, data is retrieved with a flag turned off. The information indicating whether a flag is turned on or off is retained by the flag circuit 22. The output manipulating circuit 24 operates based on the information.

In the illustrated example, from the specific address region associated with group A, data is retrieved with a flag turned on. From the specific address region associated with group B, data is retrieved with a flag turned off. From the specific address region associated with group C, data is retrieved with a flag not turned on or off. Herein, groups A, B, and C do not share the same address region. Group C may be allocated to a region other than the regions associated with groups A and B or may be allocated to part of the regions associated with groups A and B.

When an input address designates a certain specific address region, if the input address specifies any address in the region, data may be retrieved with a flag turned on. In this case, as long as access is gained continually to the same region (continual access in FIG. 9), even if data is retrieved with a flag turned on, a copy-preventive function is not effected (in other words, the output manipulating circuit 24a is not actuated).

When another region is accessed next, unless a specified address is within a region from which data is supposed to be retrieved with a flag turned off (address in group B in FIG. 9), the contents of accessed data (that is output data) are manipulated to some extent for the purpose of copy prevention. In this case, only when specific address regions are accessed according to an undefined procedure, is the output manipulating circuit 24a actuated.

The address regions are defined so that it will not take place under the normal use situation that an address belonging to group C is accessed after an address belonging to group A is accessed. Alternatively, in FIG. 9, when the power supply is turned on or when the ROM device is initialized, data may be retrieved with a flag turned off. Access is then started with group B.

Figure 10:
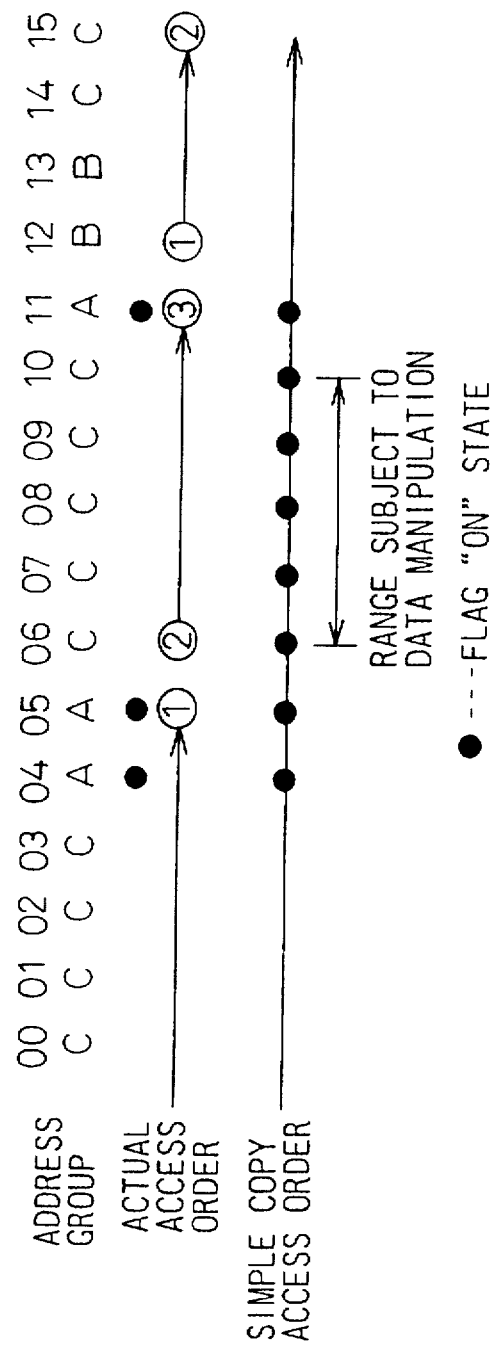
FIG. 10 is an explanatory diagram concerning the first example of copy prevention in accordance with the second embodiment.

FIG. 10 shows the first example of copy prevention in the second embodiment.

In FIG. 10, after an address indicated with (1) is accessed, another address indicated with (1) is accessed. After an address indicated with (2) is accessed, another address indicated with (2) is accessed. After an address indicated with (3) is accessed, another address indicated with (3) is accessed. In the illustrated example, an actual access order is from address 00 through addresses 01 to 05 and 12 to 15 to addresses 06 to 11. A black circle indicates that a flag is turned on.

According to the first example of copy prevention, when addresses 04 and 05 are actually accessed, data is retrieved with flags turned on. Nevertheless, since a jump is made to address 12 belonging to group B, data is retrieved with a flag turned off. This means that retrieved data is not manipulated at all (in other words, the data is provided normally).

For simple copy, when addresses 04 and 05 are accessed, data is retrieved with flags turned on. Data retrieved from addresses 06 thereafter is manipulated to some extent (in other words, data manipulation is carried out for the purpose of copy prevention). Data manipulation continues until address 12 belonging to group B is accessed and data is retrieved with a flag turned off.

Figure 11:
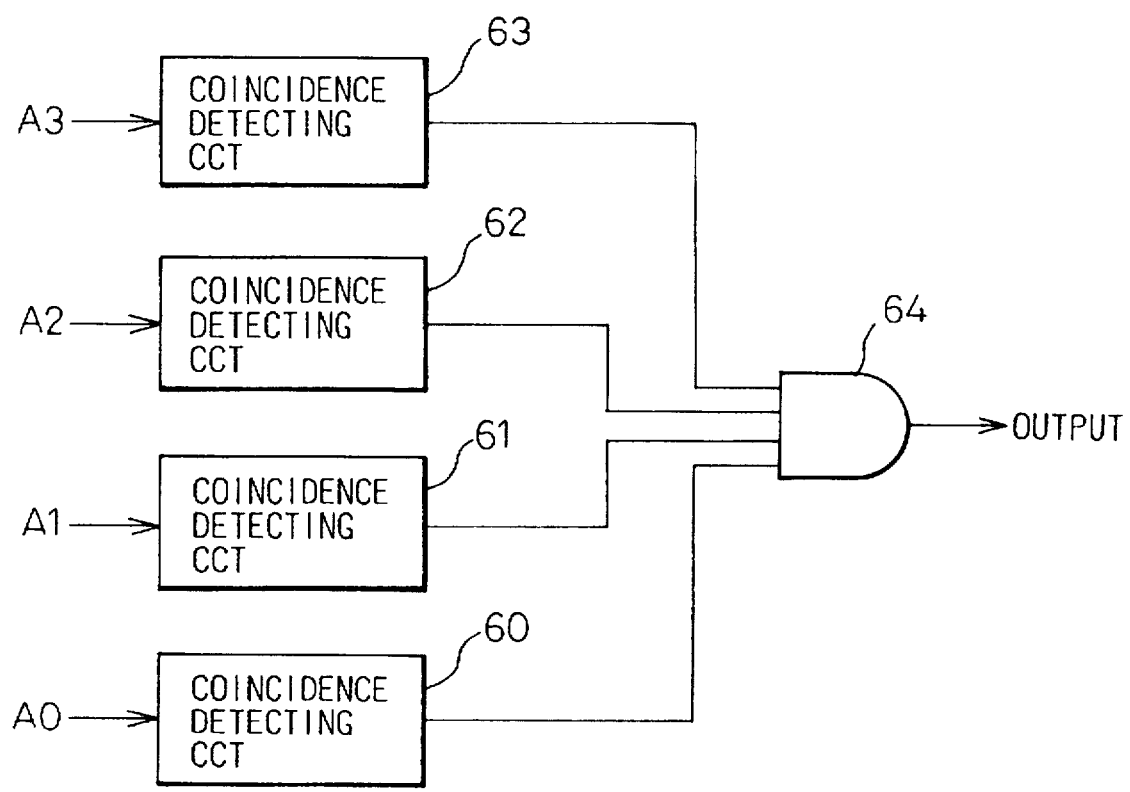
FIG. 11 shows an example of circuitry of a specific address region detecting circuit in relation to the first example of copy prevention.

FIG. 11 shows an example of circuitry of a specific address region detecting circuit in relation to the aforesaid first example of copy prevention.

In the illustrated example, a 16-bit ROM for handling four address bits A0 to A3 is constructed. In FIG. 11, reference numerals 60 to 63 denote coincidence detecting circuits having the same circuitry as the one shown in FIG. 4. The outputs of the coincidence detecting circuits are fed to an AND gate 64. When input address bits A3 to A0 indicate an address belonging to group A, the output of the AND gate 64 represents a logical 1 (indicating that a flag is turned on). When the address bits indicate an address not belonging to group A (address belonging to any other group), the output of the AND gate 64 represents a logical 0 (indicating that a flag is turned off).

FIG. 12 shows the second example of copy prevention in accordance with the second embodiment.

When a certain specific address region is accessed, if an address specified is within the region, data is retrieved with a flag turned on. It may be preprogrammed that the number of consecutive accesses given to a region is stored, and that when the stored number of accesses exceeds a defined value, whether access is gained to the region or any other region, data is retrieved with a flag turned on. Retrieved data is manipulated to some extent. In this case, a region from which data is retrieved with a flag turned off may or may not be defined.

In the second example shown in FIG. 12, assuming that group A is supposed to be accessed three times, as far as simple copy is concerned, when address 06 is accessed, data is retrieved with a flag turned on. Thereafter, after address 11 belonging to group A is accessed, unless the count indicating the number of accesses is initialized, control is not returned normally. Assuming that an even number of accesses is defined as an abnormal state, when address 11 is accessed, control is returned normally.

For counting the number of accesses, a counter or the like is used to count the outputs (1s or 0s) of the AND gate 64 in the circuit shown in FIG. 11. Determination of whether the number of accesses is even or odd is achieved using a simple flip-flop.

Figures 13A, 13B:
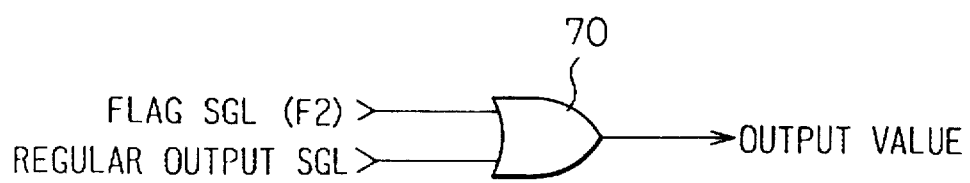
FIGS. 13a and 13b are explanatory diagrams concerning the third example of copy prevention in accordance with the second embodiment.
Figures 14A, 14B:
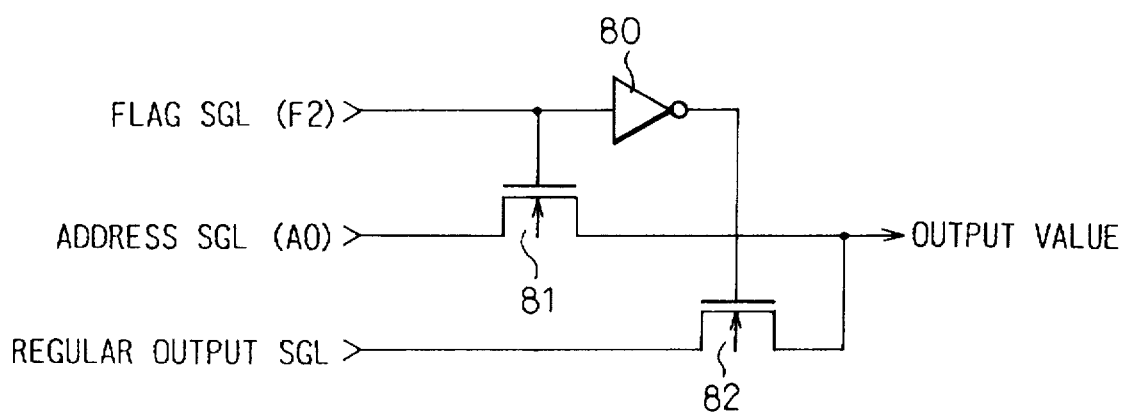
FIGS. 14a and 14b are explanatory diagrams concerning the fourth example of copy prevention in accordance with the second embodiment.
Figures 15A, 15B:
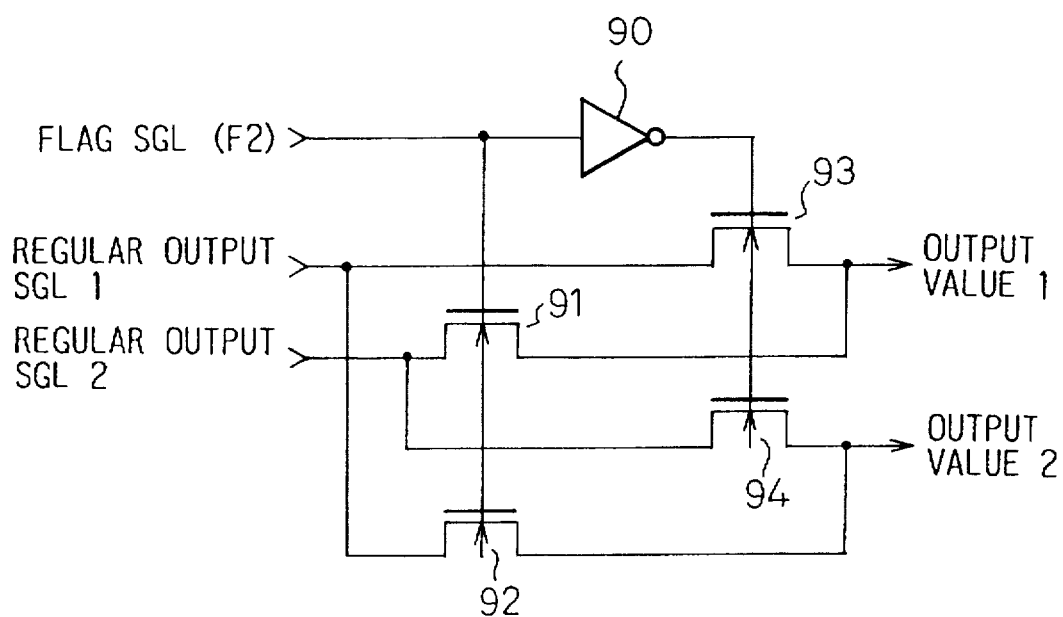
FIGS. 15a and 15b are explanatory diagrams concerning the fifth example of copy prevention in accordance with the second embodiment.

FIGS. 13a to 15b show the third, fourth, and fifth examples of copy prevention in accordance with the second embodiment. FIGS. 13a, 14a, and 15a show examples of circuitry of the output manipulating circuit 24a. FIGS. 13b, 14b, and 15b show the relationships between the input and output signals.

In the example shown in FIGS. 13a and 13b, an OR gate 70 is used to destroy the output data according to the combination of a flag signal F2 and a normalized output signal.

In the example shown in FIGS. 14a and 14b, an inverter 80 and two n-channel transistors 81 and 82 are used to destroy the output data according to the combination of the flag signal F2, address signal A0, and normalized output signal.

In the example shown in FIGS. 15a and 15b, an inverter 90 and four n-channel transistors 91 to 94 are used to destroy the output data according to the combination of the flag signal F2 and two normalized output signals 1 and 2. In this example, the normalized output signals 1 and 2 are provided selectively with a flag turned on.

(2) Means for meeting the aforesaid second requirement for the prior art

For an ordinary semiconductor integrated circuit, a delivery inspection is conducted at the time of delivery from a manufacturer. Only the products that are confirmed to operate normally are accepted. A customer who made an order and takes delivery of the products conducts a simple test to see if the products operate normally, and also conducts a printed-circuit board mounting test if necessary.

Whether or not a semiconductor integrated circuit itself operates normally is checked by following a simple pattern of accesses. During the delivery inspection or acceptance inspection, it is hard to persuade the circuit to operate in the same manner as it does in practice. Even when a semiconductor integrated circuit having a copy-preventive function is produced, since it is hard to minimize testing cost and to guarantee reliability, the incorporation of the copy-preventive function is therefore hardly acceptable.

Using the method of this embodiment, when a specific address region from which data is retrieved with a flag turned off can be located, if the specific address region and a target region are accessed alternately, it can be tested to see if a copy-preventive function operates normally at all addresses.

An address belonging to group B and an intended address are accessed alternately. If it is preprogrammed that the number of accesses should be even, when the same address is accessed continually even times, the copy-preventive function is not activated.

According to the foregoing technique, since any specific bit need not be defined, an access procedure is restrained only slightly. Although the test time may be a bit longer, a special dedicated testing apparatus is unnecessary. When a region associated with group B is defined as a small region, a person contemplating illegal copy may not be able to locate the group-B region easily. The measures as well as a means for meeting the aforesaid third requirement will be described below.

(3) Means for meeting the aforesaid third requirement for the prior art

Since more and more apparatuses for analyzing a semiconductor integrated circuit are offering high performance and high processing speeds, a semiconductor integrated circuit with a copy-preventive function can be analyzed relatively readily. In this embodiment, a circuit for turning on a flag is analyzed, and electrical connection on a chip is directly modified. As a result, measures can be taken in the state in which data is retrieved with a flag permanently off.

To be more specific, in this embodiment, the electrical connection is multi-layered. Even if an attempt is made to modify circuitry, the upper layer of connection is designed to cripple the attempt.

Another means is such that initially-produced data is transformed into other data deliberately. That is to say, even if an operation understood by a software engineer is performed to retrieve data, the retrieved data is transformed into the data intended by the software engineer.

Advantages of the foregoing technique lie in that the cost of an integrated circuit itself does not increase very greatly and that data retrieved from a chip by disabling a flag circuit is not the correct data (copy prevention).

Figure 16:
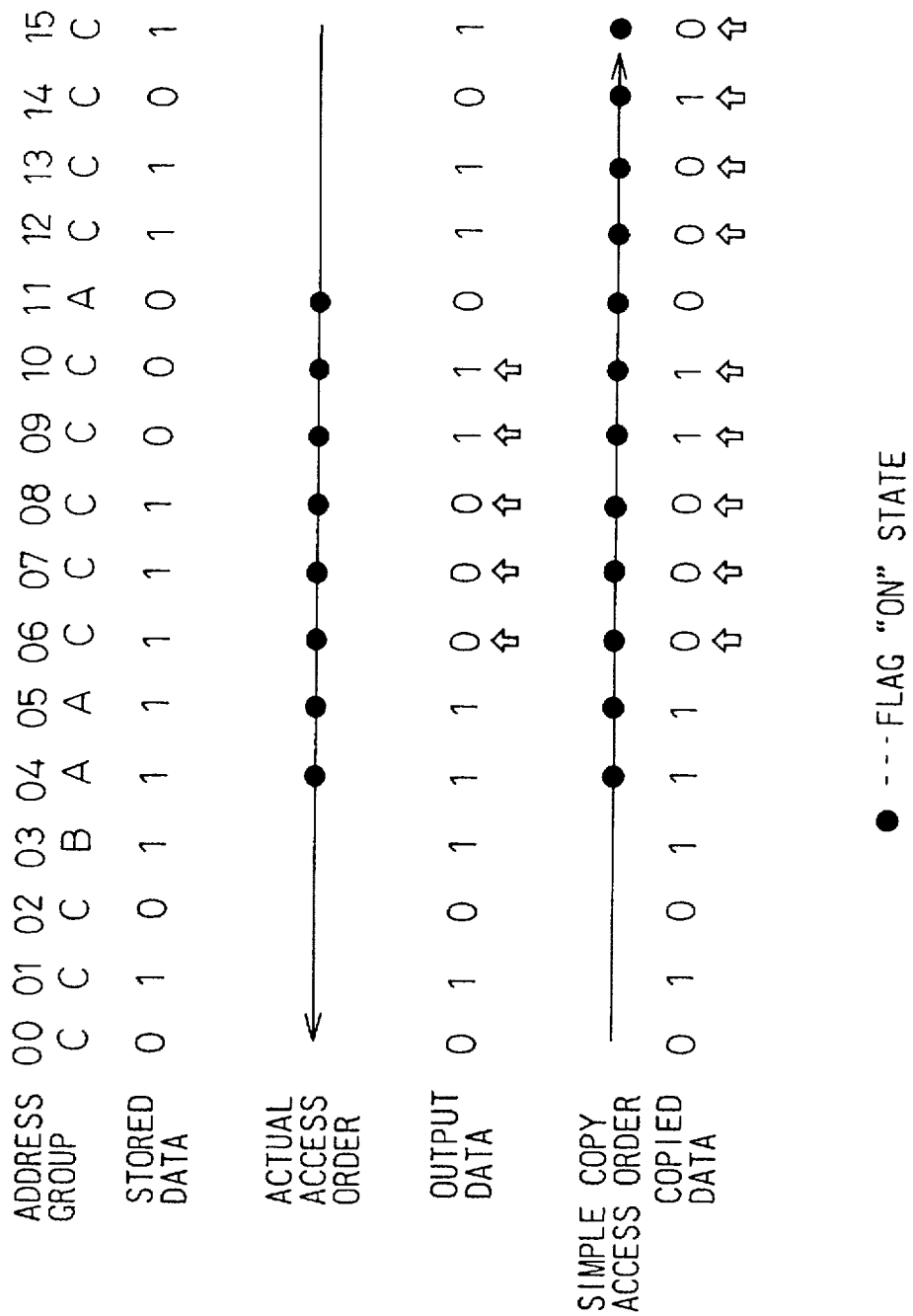
FIG. 16 is an explanatory diagram concerning the sixth example of copy prevention in accordance with the second embodiment.
Figure 17:
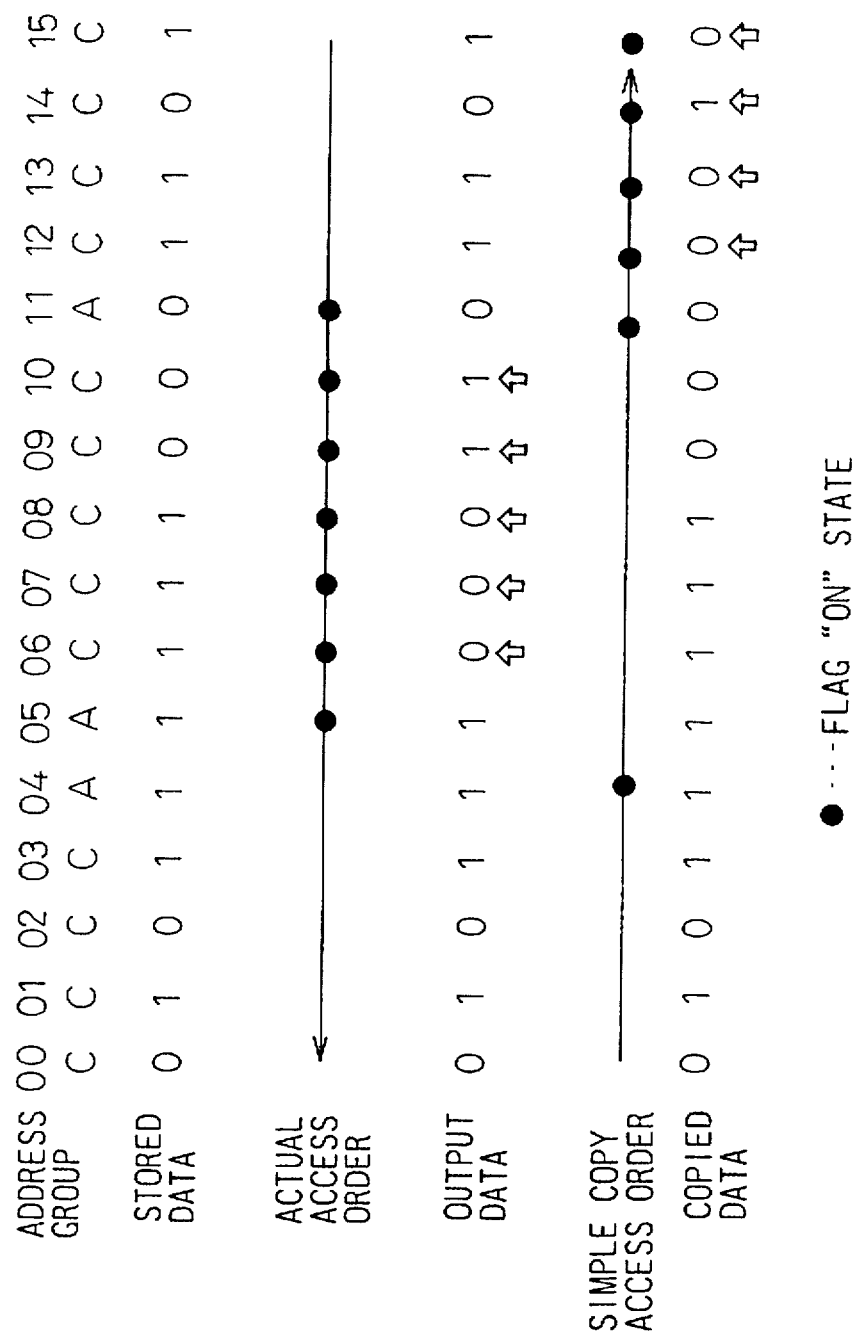
FIG. 17 is an explanatory diagram concerning the seventh example of copy prevention in accordance with the second embodiment.

Examples of copy prevention based on the technique will be shown in FIGS. 16 and 17.

In the example shown in FIG. 16, with a flag turned on, data to be retrieved is transformed into data representing an opposite logic level. With a flag turned on, data at an address belonging to group A remains unaffected. For data at an address belonging to group B, a flag appended to the data is turned off.

As mentioned above, actually retrieved data is exactly the data intended by a customer who made an order for a semiconductor integrated circuit (ROM device).

Likewise, in the example shown in FIG. 17, with a flag turned on, data to be retrieved is transformed into data representing an opposite logical level. The flag-on state is released when an even number of accesses are gained to an address belonging to group A. With a flag turned on, data at an address belonging to group A remains unaffected.

Similarly to the example of copy prevention in FIG. 16, actually retrieved data is exactly the data intended by a customer who made an order for a semiconductor integrated circuit (ROM device).

Figure 18:
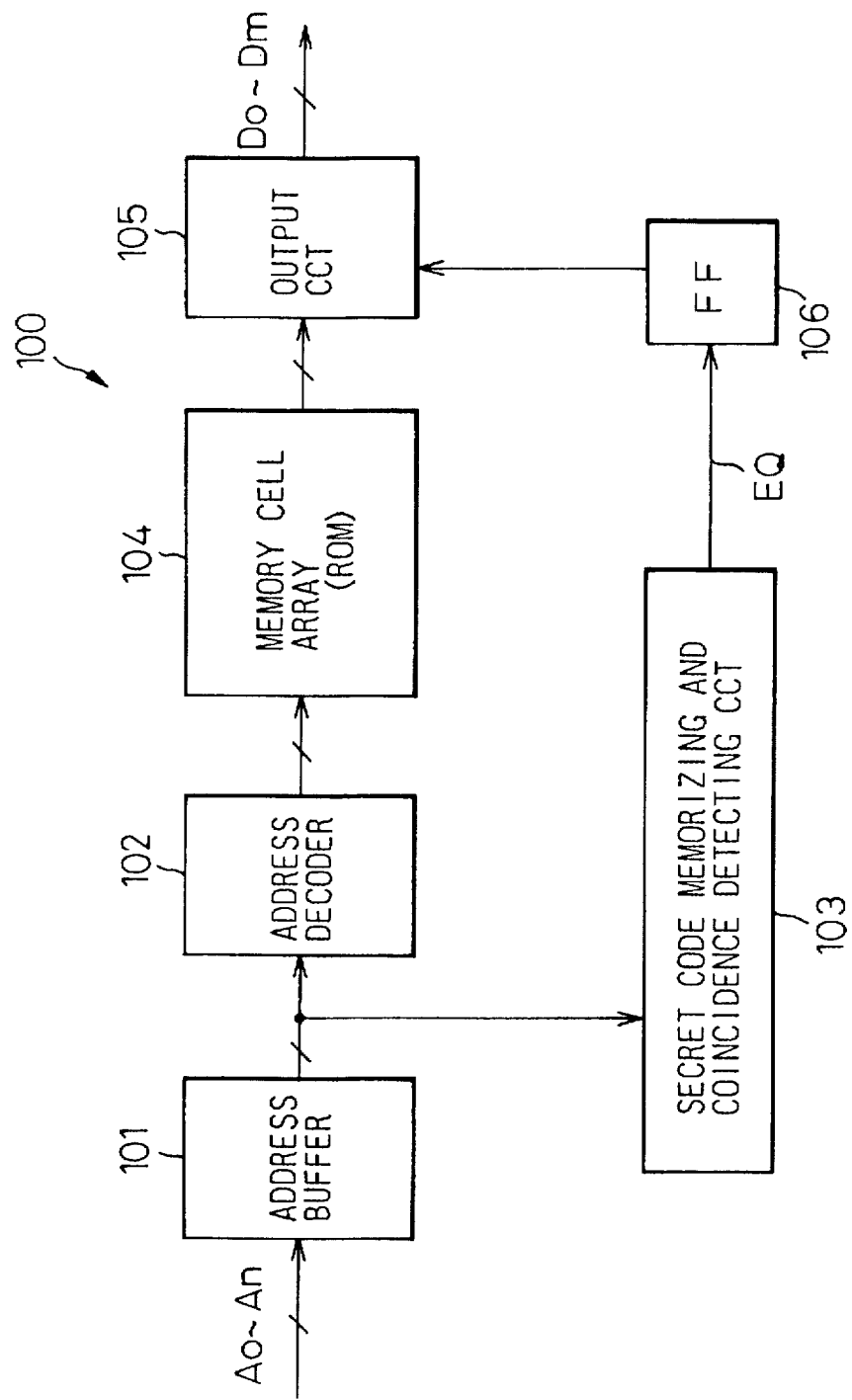
FIG. 18 is a block diagram schematically showing the configuration of a ROM device with a copy-preventive function in accordance with the third embodiment of the present invention.

FIG. 18 schematically shows the configuration of a ROM device with a copy-preventive function in accordance with the third embodiment of the present invention.

In an illustrated device 100, an input address signal A0-An is retained in an address buffer 101. The retained address signal is fed to each of an address decoder 102 and a secret code memorizing and coincidence detecting circuit 103. Based on the result of decoding performed by the address decoder 102, any of word lines and bit lines in a memory cell array (ROM) 104 are selected, data in a memory cell defined by the selected lines is read out. The read data is provided as data D0-Dm via an output circuit 105.

When the output address of the address buffer 101 is consistent with a specific secret code, the secret code memorizing and coincidence detecting circuit 103 outputs a consistency signal EQ. A flip-flop (FF) 106 retains the consistency signal EQ. When the flip-flop 106 retains the consistency signal EQ, the output circuit 105 stops outputting data or supplies data different from the correct data from the memory cell array 104. Alternatively, the output of the address decoder 102 may differ from the correct output but the output of the output circuit 105 may not.

An address consistent with a secret code shall not be used when the device 100 is operated in normal use form. This disables usage other than normal usage (for example, illegal use of data).

Referring to FIGS. 19 to 26, examples of circuitry of the secret code memorizing and coincidence detecting circuit 103 will be described below.

For brevity's sake, the examples shown in FIGS. 19 to 26 are concerned with the circuitry in which an input address signal is four bits long; that is, composed of bits A0 to A3. Transistors shown in the drawings are metal-insulator-silicon (MIS) FETs. P-channel transistors are assigned an outgoing arrow, but n-channel transistors are not.

Figure 19:
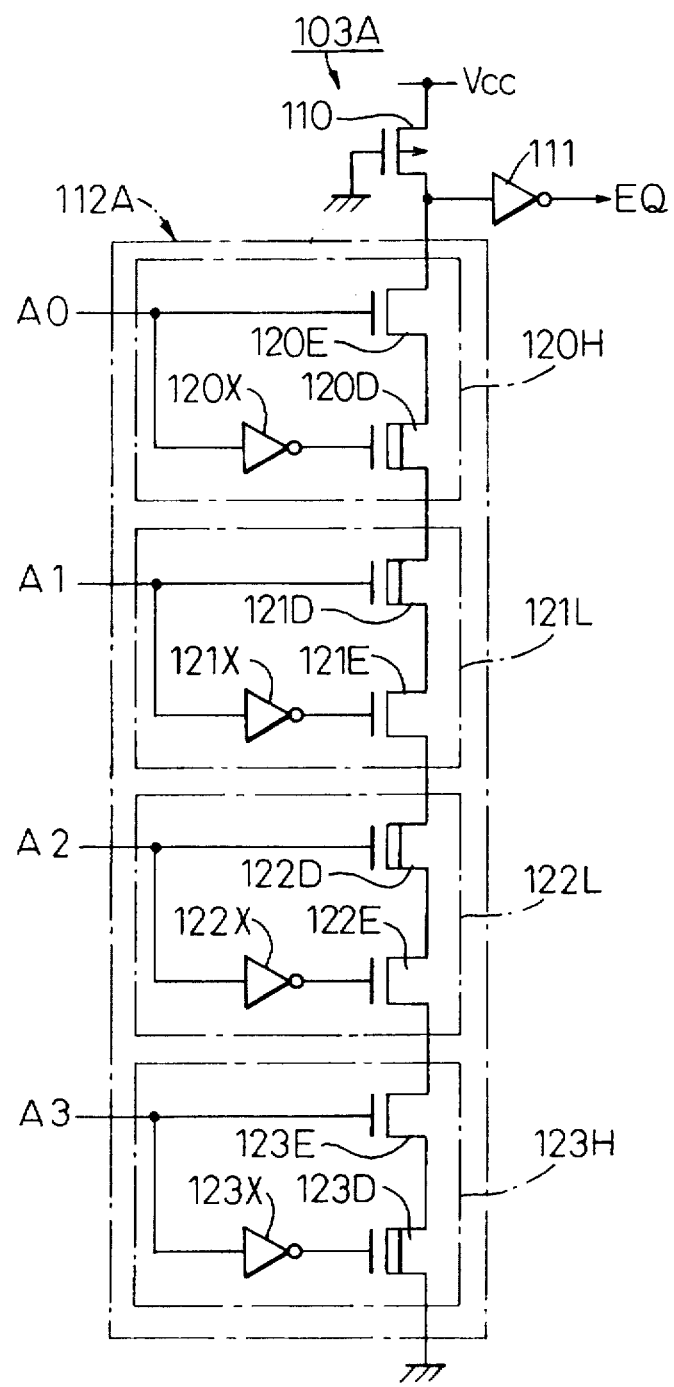
FIG. 19 is a circuit diagram showing the first example of circuitry of a secret code memorizing and coincidence detecting circuit shown in FIG. 18.

FIG. 19 shows the first example (103A) of circuitry of the secret code memorizing and coincidence detecting circuit 103.

The illustrated secret code memorizing and coincidence detecting circuit 103A includes a p-channel MISFET 110 serving as a load having the source and gate thereof connected to the power line Vcc and ground line respectively. The drain of the load FET 110 is connected to each of the input terminal of an inverter 111 and one terminal of a bit serial circuit 112A. The bit serial circuit 112A is composed of four basic circuits 120H, 121L, 122L, and 123H that are connected in series with one another. The other terminal of the bit serial circuit 112A is grounded.

In the basic circuit 120H, a n-channel MISFET 120E and n-channel MISFET 120D are connected in series with each other. The input and output terminals of an inverter 120X are connected to the gates of the FETs 120E and 120D. An address signal A0 is fed to the gate of the FET 120E. The FET 120E is of the enhancement type. The threshold voltage of the FET 120E corresponds to the middle between high and low levels. When the address signal A0 is high, the FET 120E is turned on. When the address signal A0 is low, the FET 120E is turned off. In contrast, the FET 120D is of the depletion type and is turned on irrespective of the level of the output of the inverter 120X. The basic circuit 120H is therefore turned on only when the address signal A0 is high.

An alphabet H or L appended to the reference numeral of a circuit element of a basic circuit means that when the potential (that is the address signal) at the control input terminal of the circuit element is high, the circuit element is turned on.

The basic circuits 121L, 122L, and 123H have the same circuitry as the basic circuit 120H. Reference numerals 121X, 122X, and 123X denote inverters. 121E, 122E, and 123E denote enhancement-type n-channel MISFETs. 121D, 122D, and 123D denote depletion-type n-channel MISFETs. Address signals A1, A2, and A3 are fed to the control input terminals of the basic circuits 121L, 122L, and 123H respectively.

In the foregoing circuitry, the bit serial circuit 112A stores a binary secret code 1001 on a fixed basis. Only when an address signal A3-A0 is consistent with the secret code, is the bit serial circuit 112A turned on. This causes the consistency signal EQ provided by the inverter 111 to go high. In the other states (in which the address signal is inconsistent with the secret code), the consistency signal EQ is driven low.

An n-channel MISFET is used as each memory cell of the memory cell array 104 shown in FIG. 18. Depending on whether or not the MISFET is set to the depletion mode through ion implantation, data bits to be defined in a secret code memorizing and coincidence detecting circuit may be varied. As this type of secret code memorizing and coincidence detecting circuit, the secret code memorizing and coincidence detecting circuit 103A in FIG. 19 is employed. Data can be written in the memory cell array 104 and secret code memorizing and coincidence detecting circuit 103A by performing the same process. This is preferable because it obviates the necessity of a special process for writing data in the secret code memorizing and coincidence detecting circuit 103A.

The depletion-type n-channel MISFETs 120D, 121D, 122D, and 123D should merely be turned on irrespective of the potentials at the gates. By increasing the degree of ion implantation, the depletion layer region of an FET may be widened in order to strap the source and drain thereof. The same applies to the other examples to be described below.

The secret code memorizing and coincidence detecting circuit 103A in the first example of circuitry is composed of a secret code memorizing unit and coincidence detecting unit that are united with each other. Due to the simplicity of the circuitry, the number of circuit elements is small. The simple circuitry is acceptable in an effort to increase the storage capacity of a memory cell array.

Figure 20:
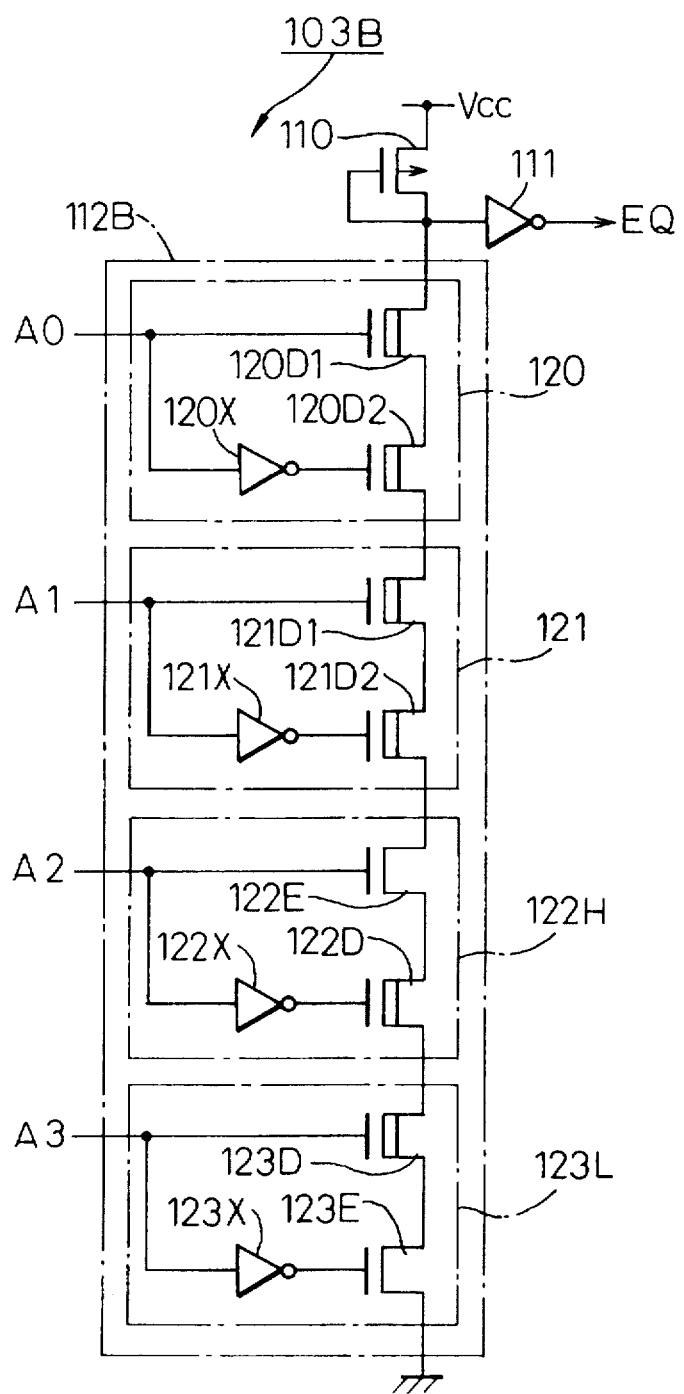
FIG. 20 is a circuit diagram showing the second example of circuitry of the secret code memorizing and coincidence detecting circuit shown in FIG. 18.

A larger number of secret codes is preferred. As shown in FIG. 20, in a secret code memorizing and coincidence detecting circuit 103B relating to the second example of circuitry, a basic circuit 120 is composed of depletion-type FETs 120D1 and 120D2, and a basic circuit 121 is composed of depletion-type FETs 121D1 and 121D2. The basic circuits 120 and 121 are therefore turned on irrespective of the potentials (address signals A0 and A1) at the control input terminals thereof.

In the secret code memorizing and coincidence detecting circuit 103B of the second example, when the address signal A3-A0 represents any of consecutive binary codes 0100 to 0111, a consistency signal EQ goes high. The p-channel MISFET 110 serving as a load has the gate and drain strapped.

The employment of a plurality of secret codes is preferable to that of a single continuous code.

Figure 21:
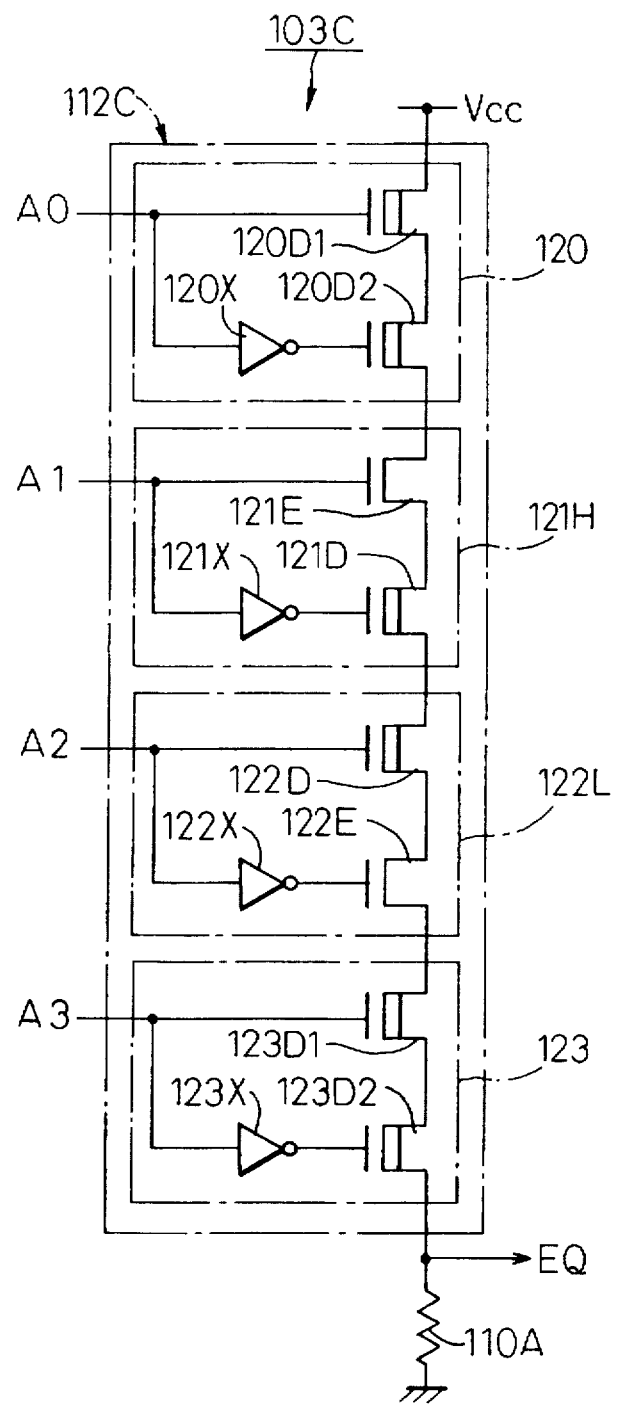
FIG. 21 is a circuit diagram showing the third example of circuitry of the secret code memorizing and coincidence detecting circuit shown in FIG. 18.

In a secret code memorizing and coincidence detecting circuit 103C of the third example of circuitry, as shown in FIG. 21, FETs 120D1 and 120D2 in a basic circuit 120 and FETs 123D1 and 123D2 in a basic circuit 123 not adjoining the basic circuit 120 are of the depletion type. A bit serial circuit 112C has one terminal thereof connected to the power line Vcc and the other terminal thereof grounded via a load resistor 110A. The consistency signal EQ is supplied from the other terminal of the bit serial circuit 112C. The load resistor 110A may be an n-channel MISFET whose gate and drain are strapped.

In the secret code memorizing and coincidence detecting circuit 103C of the third example of circuitry, only when the address signal A3-A0 represents the binary code 0010, 0011, 1010, or 1011, does the consistency signal EQ go high.

The aforesaid memory cell array 104 is available in various types. Whichever type of memory cell array is employed, the secret code memorizing and coincidence detecting circuit 103 and memory cell array 104 should be able to be produced by performing the same process. This is preferred because of the low manufacturing cost. One n-channel MISFET may be used as each memory cell in the memory cell array 104. Data bits to be defined in a secret code memorizing and coincidence detecting circuit may be varied depending on whether or not ions whose polarities are opposite to those used for forming a depletion-type transistor are implanted between the source and drain of the n-channel MISFET so that the threshold voltage of the MISFET will be higher than a high level (that is, depending on whether the MISFET is of a high threshold type).

Figure 22:
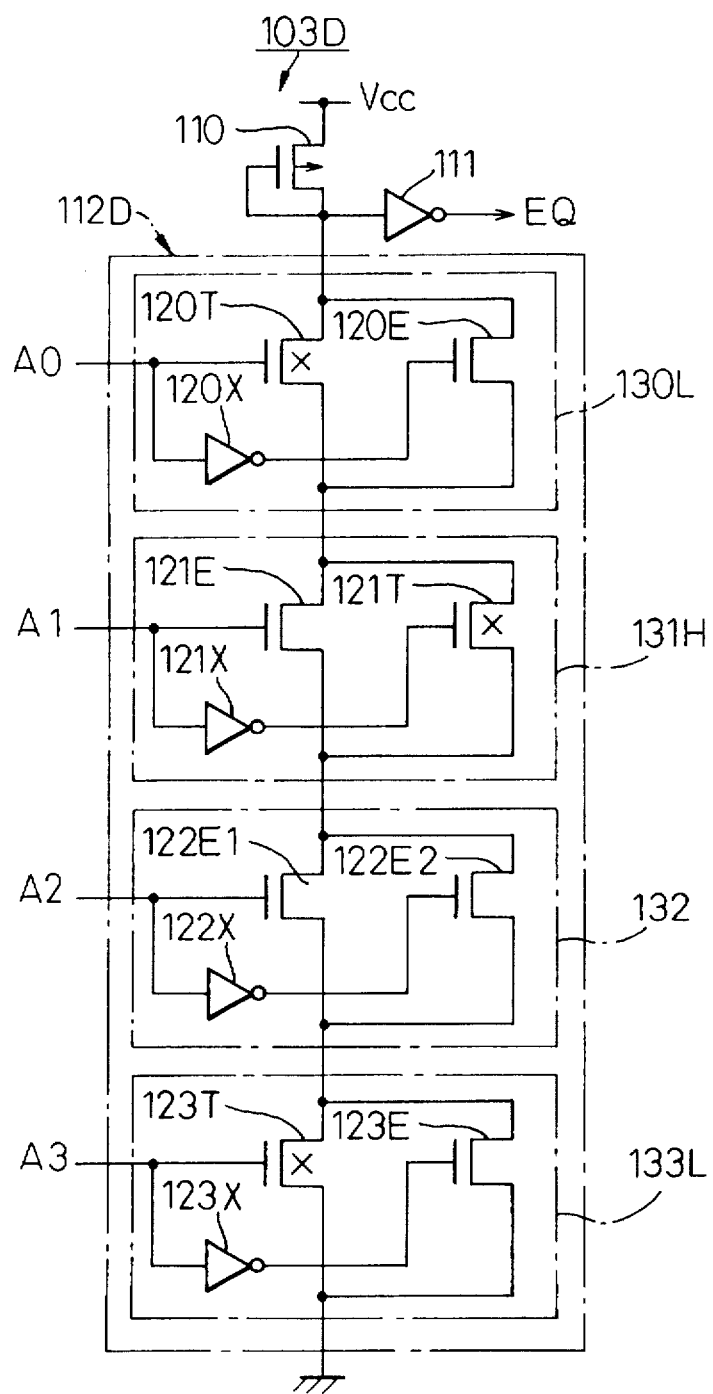
FIG. 22 is a circuit diagram showing the fourth example of circuitry of the secret code memorizing and coincidence detecting circuit shown in FIG. 18.

As this type of secret code memorizing and coincidence detecting circuit, a secret code memorizing and coincidence detecting circuit 103D of the fourth example of circuitry shown in FIG. 22 is employed. A FET bearing a sign x is a high threshold type FET.

In the secret code memorizing and coincidence detecting circuit 103D of the fourth example of circuitry, a bit serial circuit 112D has basic circuits 130L, 131H, 132, and 133L, which are of the parallel connection type, connected in series with one another. The basic circuit 130L has an FET 120T and FET 120E connected in parallel with each other. The input and output terminals of an inverter 120X are connected to the gates of the FET 120T and FET 120E. An address signal A0 is fed to the input terminal of the inverter 120X. The FET 120E is of the normal enhancement type, while the FET 120T is of the high threshold type.

An FET 121T and FET 123T in the basic circuits 131H and 133L are of the high threshold type. The basic circuits 130L, 131H, and 133L are turned on when the potentials at the control input terminals thereof (address signals A0, A1, and A3) are low, high, and low respectively. By contrast, an FET 122E1 and FET 122E2 in the basic circuit 132 are of the normal enhancement type. The basic circuit 132 is therefore turned on irrespective of the potential at the control input terminal thereof (address signal A2).

In the secret code memorizing and coincidence detecting circuit 103D of the fourth example of circuitry, only when the address signal A3-A0 represents a binary code 0010 or 0110, is the consistency signal EQ high.

Data bits to be defined in a secret code memorizing and coincidence detecting circuit may be varied depending on whichever of contact holes formed in the source and drain of a transistor serving as each memory cell in the memory cell array 104 is selected to isolate the source or drain.

Figure 23:
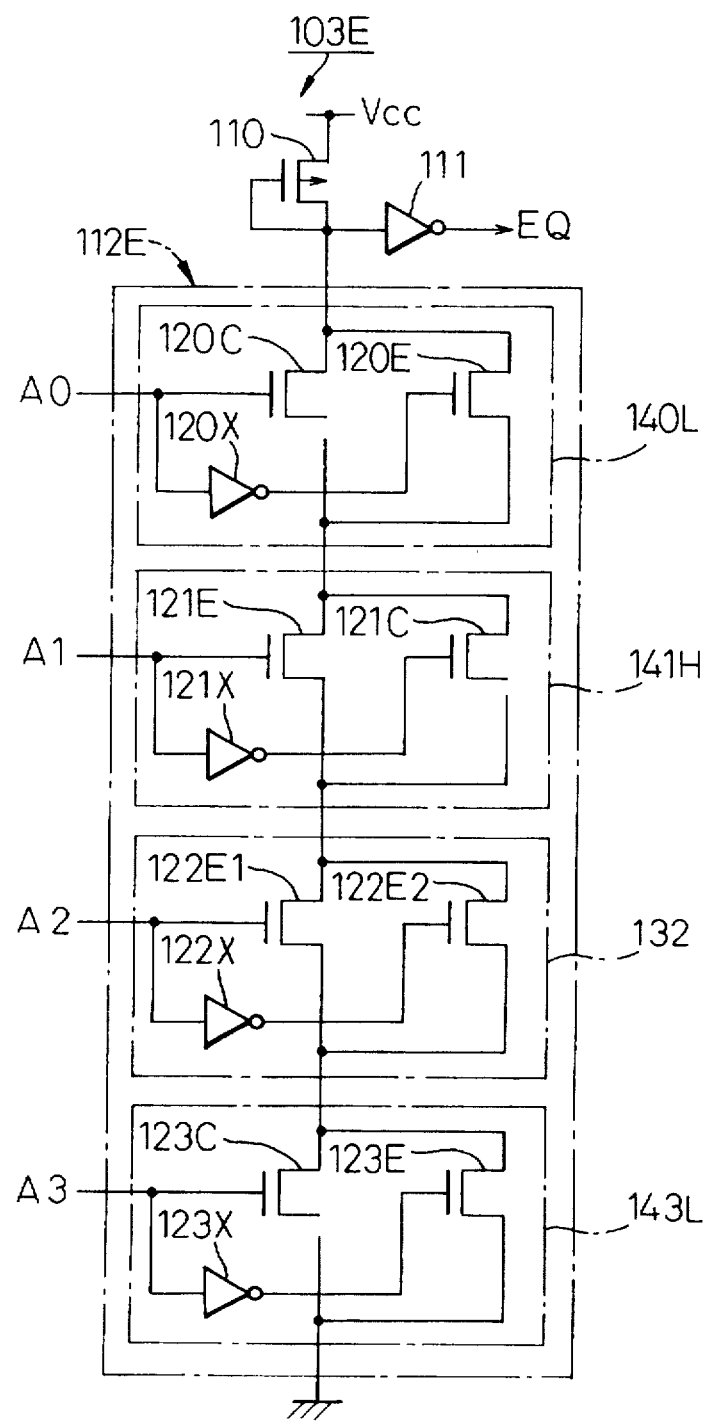
FIG. 23 is a circuit diagram showing the fifth example of circuitry of the secret code memorizing and coincidence detecting circuit shown in FIG. 18.
Figure 24:
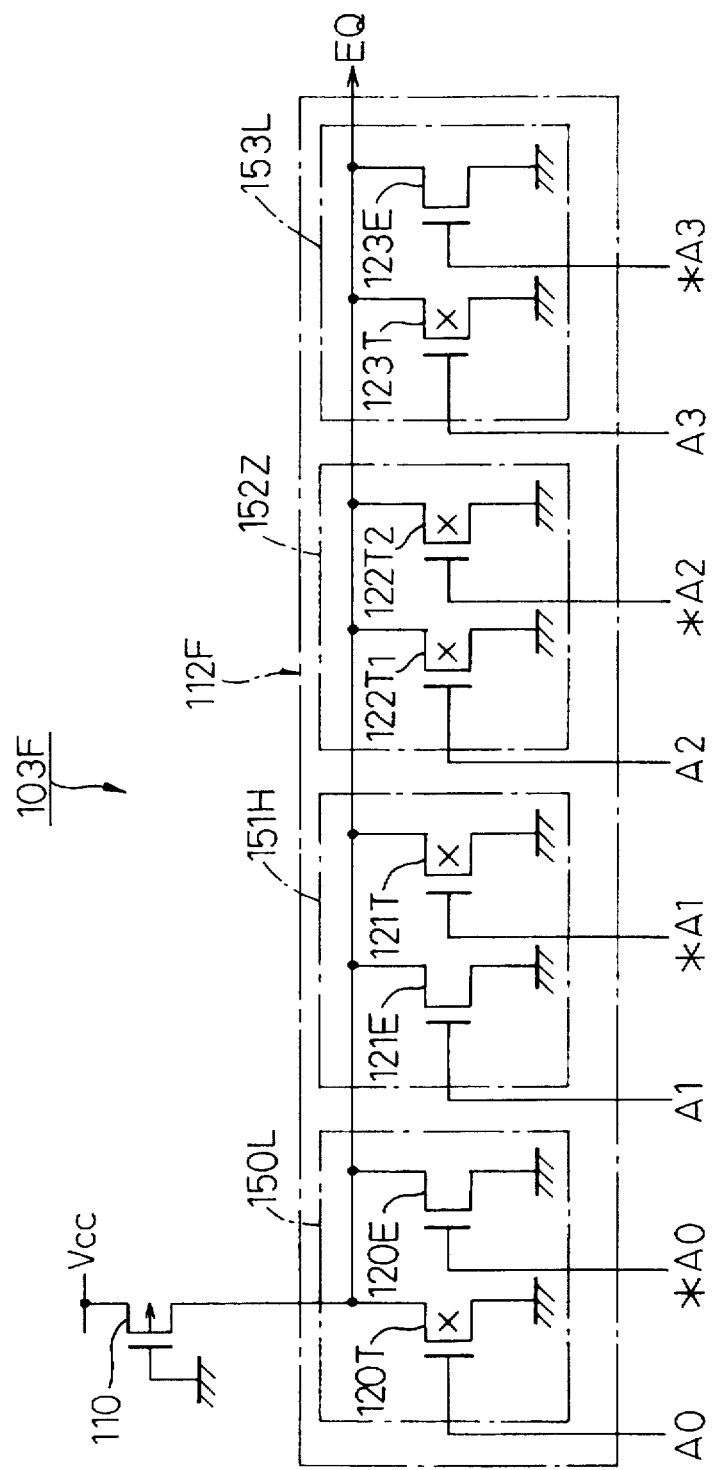
FIG. 24 is a circuit diagram showing the sixth example of circuitry of the secret code memorizing and coincidence detecting circuit shown in FIG. 18.
Figure 25:
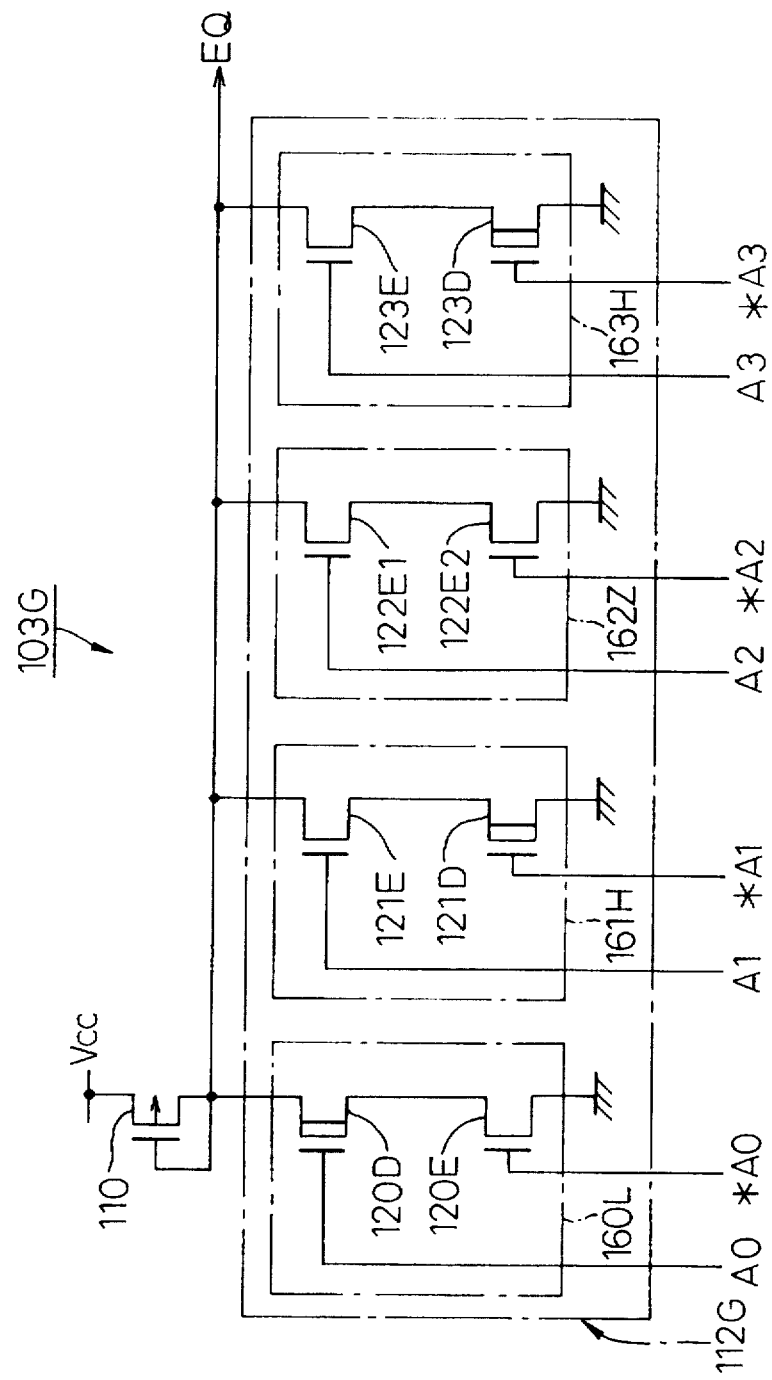
FIG. 25 is a circuit diagram showing the seventh example of circuitry of the secret code memorizing and coincidence detecting circuit shown in FIG. 18.

As this type of secret code memorizing and coincidence detecting circuit, a secret code memorizing and coincidence detecting circuit 103E of the fifth example of circuitry shown in FIG. 23 is employed. In FIG. 23, an FET denoted by a reference numeral padded with C is of a floating type in which no contact hole is formed in the source thereof.

In a bit serial circuit 112E in FIG. 23, FETs 120C, 121C, and 123C in basic circuits 140L, 141H, and 143L correspond to the FETs 120T, 121T, and 123T in FIG. 22. The other circuit elements are identical to those in FIG. 22.

In the aforesaid first to fifth examples, a secret code is written in a bit serial circuit. Alternatively, a secret code may be written in a bit parallel circuit. An example of writing a secret code in a bit parallel circuit is shown as the sixth example of circuitry in FIG. 24.

In a secret code memorizing and coincidence detecting circuit 103F in the sixth example of circuitry, a bit parallel circuit 112F is interposed between the p-channel MISFET 110 serving as a load and the ground line. In the bit parallel circuit 112F, basic circuits 150L, 151H, 152Z, and 153L are connected in parallel with one another. In the basic circuit 150L, n-channel MISFETs 120T and 120E are connected in parallel with each other. The FET 120E is of the normal enhancement type, while the FET 120T is of the high threshold type. When the address buffer 101 shown in FIG. 18 is realized with a complementary circuit, an inverter need not be included in a basic circuit. The address signal A0 and a reverse signal *A0 that is active in an opposite logical state relative to the address signal A0 are fed to the FET 120T and FET 120E.

The basic circuits 151H, 152Z, and 153L have the same circuitry as the basic circuit 1SOL. FETs 121T and 123T in the basic circuits 151H and 153L are of the high threshold type. By contrast, both n-channel MISFETs 122T1 and 122T2 in the basic circuit 152Z are of the high threshold type.

In the secret code memorizing and coincidence detecting circuit 103F in the sixth example of circuitry, only when the address signal A3-A0 represents a binary code 1001 or 1101, does the consistency signal EQ go high.

In the bit parallel circuit, depletion-type n-channel MIS-FETs can be employed. An example of using the depletion-type n-channel MISFETs is shown as the seventh example of circuitry in FIG. 25.

In a secret code memorizing and coincidence detecting circuit 103G of the seventh example of circuitry, a bit parallel circuit 112G has basic circuits 160L, 161H, 162Z, and 163H connected in parallel with one another. In the basic circuit 160L, n-channel MISFETs 120D and 120E are connected in series with each other. The FET 120E is of the normal enhancement type, while the FET 120D is of the depletion type.

The basic circuits 161H, 161Z, and 163H have the same circuitry as the basic circuit 160L. In the basic circuit 162Z, when one of enhancement-type FETs 122E1 and 122E2 is on, the other thereof is off. The basic circuit 162Z is therefore normally off.

In the secret code memorizing and coincidence detecting circuit 103G of the seventh example of circuitry, when the address signal A3-A0 represents a binary code 0001 or 0101, the consistency signal EQ goes high.

In the aforesaid examples of circuitry, when a secret code consists of consecutive codes, the first code represents an even address and the last code represents an odd address. This restraint is removed in the eighth example of circuitry (See FIG. 26) described below.

In a secret code memorizing and coincidence detecting circuit 103H of the eight example of circuitry, a plurality of the bit serial circuits 112 each included in the first example of circuitry (See FIG. 19) is connected in parallel with one another. Specifically, bit serial circuits 112P, 112Q, and 112R are connected in parallel with one another between the p-channel MISFET 110 serving as a load and the ground line. In the bit serial circuit 112P, basic circuits 220H, 221H, 222L, and 223L are connected in series with one another. In the bit serial circuit 112Q, basic circuits 320, 321, 322H, and 323L are connected in series with one another. In the bit serial circuit 112R, basic circuits 420L, 421L, 422L, and 423H are connected in series with one another.

Only when the bit serial circuit 112P, 112Q, or 112R is on, does the consistency signal EQ go high. When the address signal A3-A0 represents a binary code 0011, the bit serial circuit 112P is turned on. When the address signal A3-A0 represents any of binary codes 0100 to 0111, the bit serial circuit 112Q is turned on. When the address signal A3-A0 represents a binary code 1000, the bit serial circuit 112R is turned on.

When the address signal A3-A0 represents a binary code 0011 or any of binary codes 0100 to 1000, the consistency signal EQ goes high. The last one of consecutive codes represents an even address but not an odd address.

The form of a secret code memorizing and coincidence detecting circuit is not limited to those in the aforesaid examples of circuitry but may be varied diversely.

Figure 26:
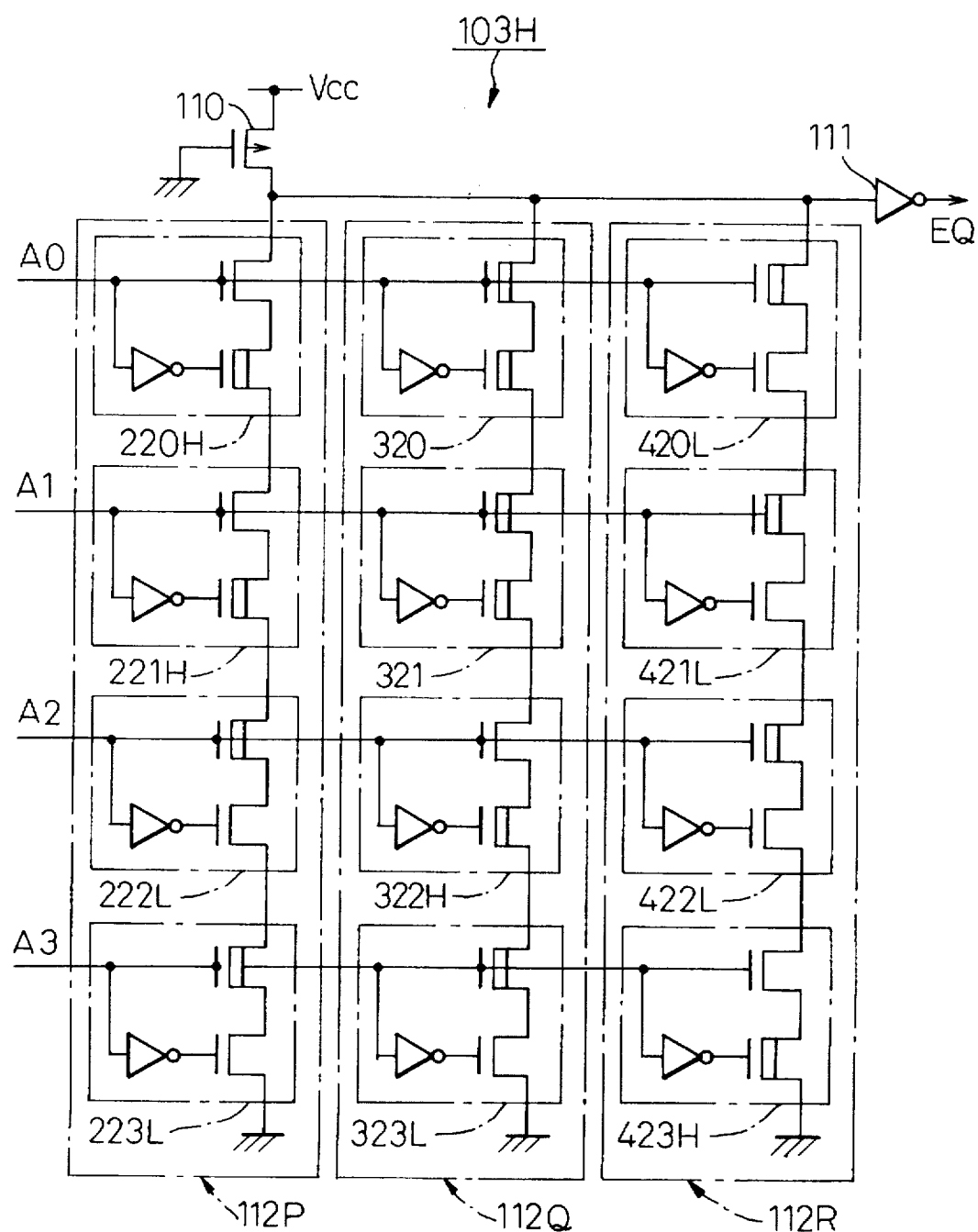
FIG. 26 is a circuit diagram showing the eighth example of circuitry of the secret code memorizing and coincidence detecting circuit shown in FIG. 18.

In FIG. 26, for example, data bits to be stored in the bit serial circuits 112P, 112Q, and 112R are pre-defined. By selecting any one or two of contact holes formed to connect the drain of the load FET 110 with one terminals of the bit serial circuits 112P, 112Q, and 112R, a plurality of secret codes can be produced easily with respect to a masked ROM containing the same data.

Figure 27:
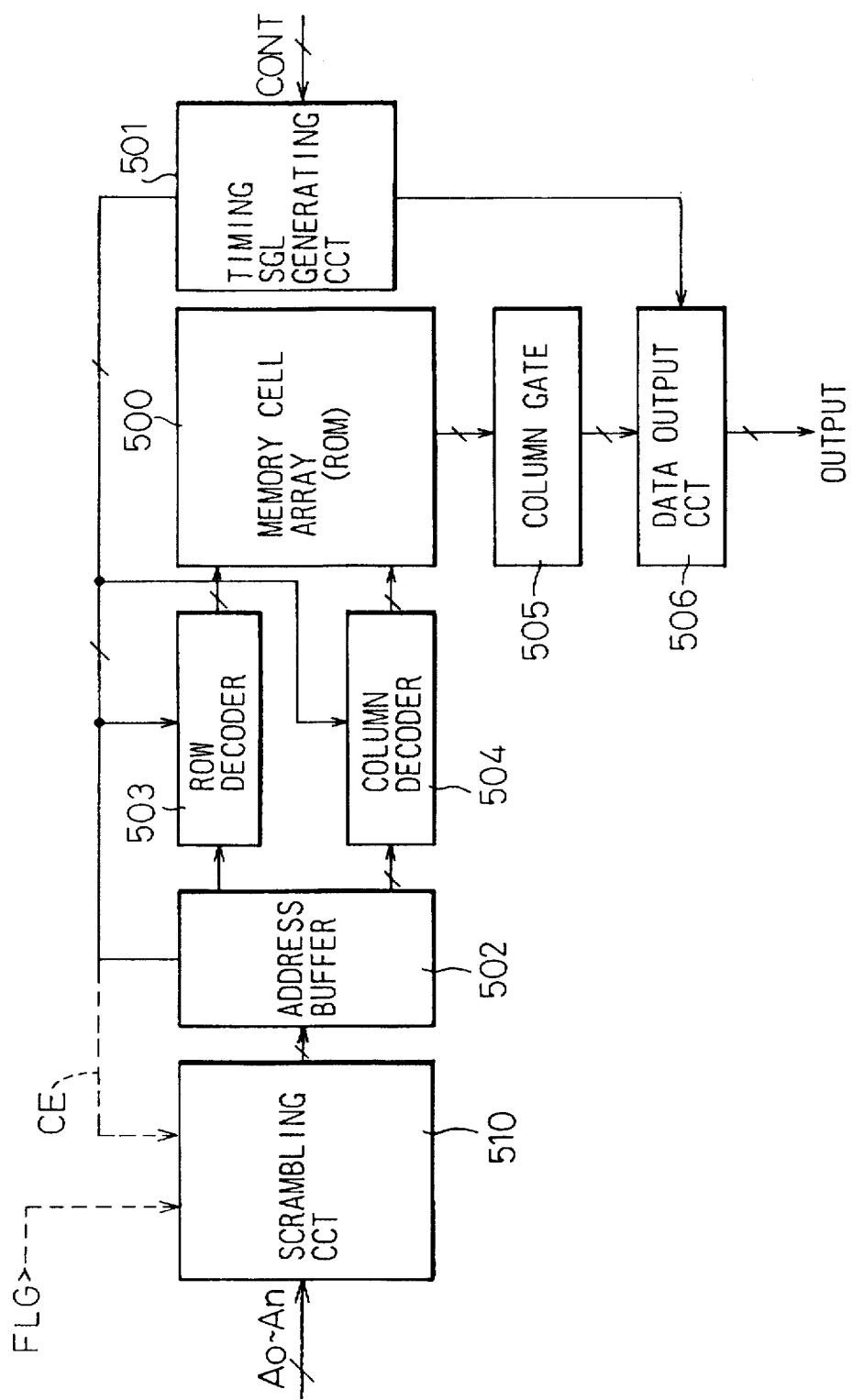
FIG. 27 is a block diagram schematically showing the configuration of a ROM device with a copy-preventive function in accordance with the fourth embodiment of the present invention.

FIG. 27 schematically shows the configuration of a ROM device with a copy-preventive function in accordance with the fourth embodiment of the present invention.

A memory cell array 500, a timing signal generating circuit 501, an address buffer 502, a row decoder 503, a column decoder 504, and a column gate 505 correspond to the circuit elements 10 to 15 in the first embodiment (See FIG. 3). A data output circuit 506 corresponds to the circuit elements 16 and 17 in the first embodiment (See FIG. 3).

The ROM device of this embodiment is characterized in that a scrambling circuit 510 is installed in the preceding stage of the address buffer 502 so that the bits A0 to An of an address signal can be scrambled and sent to the address buffer 502 in the succeeding stage. A signal FLG indicated with a dashed line is a scrambling activation signal. CE denotes a Chip Enable signal (contained in a control signal CONT fed externally to the timing signal generating circuit 501).

Figure 28:
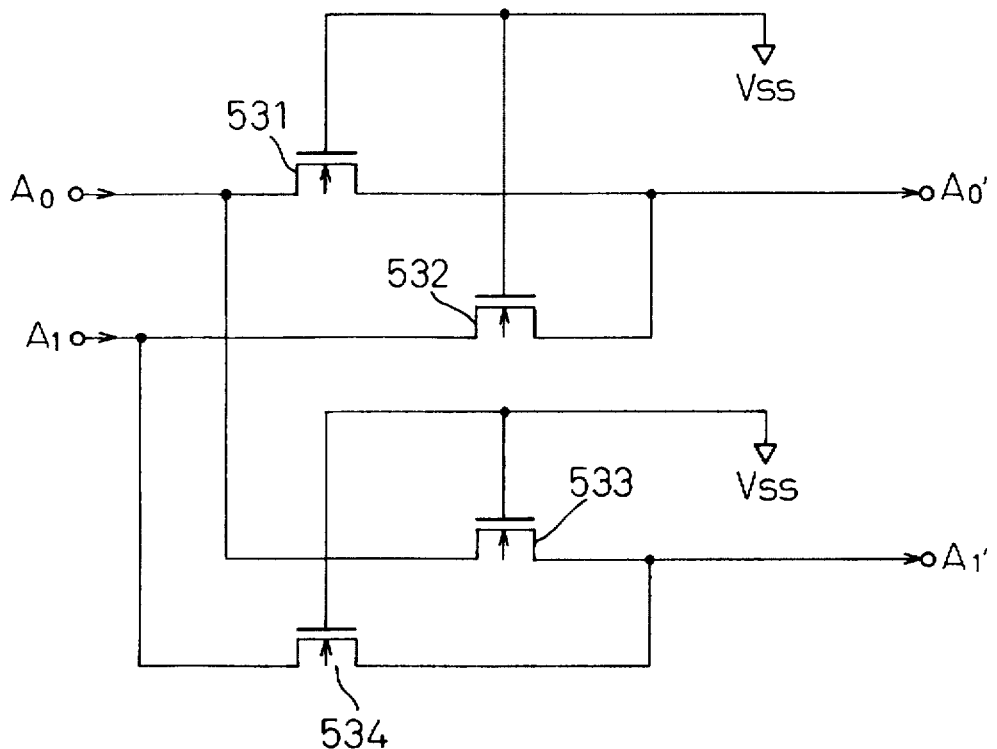
FIG. 28 is a circuit diagram showing an example of circuitry of a scrambling circuit shown in FIG. 27.

FIG. 28 shows an example of circuitry of a scrambling circuit. For brevity's sake, FIG. 28 shows the circuitry in which two bits A0 and A1 of an address signal are scrambled.

The illustrated scrambling circuit has n-channel transistors 531 and 532 connected between address bit input terminals A0 and A1 and an address bit output terminal A0', and n-channel transistors 533 and 534 connected between the address bit input terminals A0 and A1 and an address bit output terminal A1'. The gates of the transistors are connected to the low-potential power line Vss (0 V).

Among the n-channel transistors 531 to 534, either of the transistors 531 and 532 and either of the transistors 533 and 534 are produced as depletion-type transistors through ion implantation employed in wafer fabrication for forming a semiconductor integrated circuit. The two remaining transistors function as enhancement-type transistors.

In the illustrated circuitry, the gates of the n-channel transistors 531 to 534 are connected to the power line Vss. The depletion-type transistors are normally on, while the enhancement-type transistors are normally off.

By forming the n-channel transistors 531 to 534 as depletion-type transistors, the address bits A0 and A1 can be scrambled.

When the transistors 532 and 533 are formed as depletion-type transistors through ion implantation, an address bit A1 is supplied from the address bit output terminal A0', and an address bit A0 is supplied from the address bit output terminal A1'. When the transistors 531 and 533 are formed as depletion-type transistors through ion implantation, the address bit A0 is supplied from both the address bit output terminals A0' and A1'.

However, when the transistors 531 and 534 are formed as depletion-type transistors, the right address bits A0 and A1 are supplied from the address bit output terminals A0' and A1'. The intended scrambling cannot be achieved. The pair of transistors must not be formed as depletion-type transistors.

Figure 29:
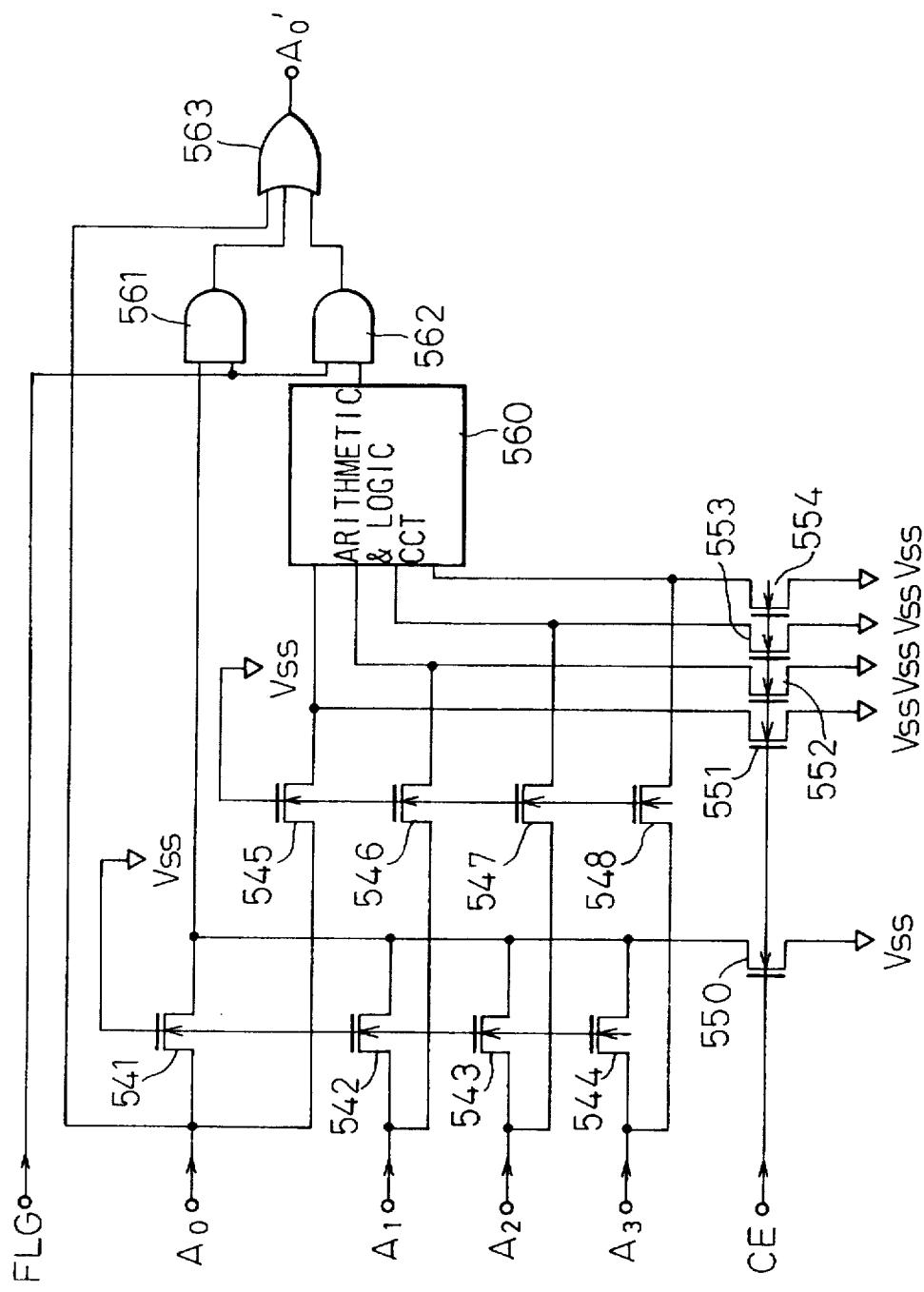
FIG. 29 is a circuit diagram showing another example of circuitry of the scrambling circuit shown in FIG. 27.

FIG. 29 shows another example of circuitry of a scrambling circuit. For brevity's sake, this illustrated example also provides the circuitry in which the four bits A0 to A3 of an address signal are scrambled.

A scrambling circuit in FIG. 29 comprises n-channel transistors 541 to 544 each having one terminal thereof connected to address bit input terminal A0 to A3, n-channel transistors 545 to 548 each having one terminal thereof connected to address bit input terminals A0 to A3, an n-channel transistor 550 connected between the other terminals of the transistors 541 to 544 and a low-potential power line Vss (0 V), n-channel transistors 551 to 554 connected between the other terminals of the transistors 545 to 548 and the power line Vss, an arithmetic and logic circuit 560 for performing arithmetic and logical operations (for example, AND, OR, NOT, exclusive OR) on the basis of signals supplied from the other terminals of the transistors 545 to 548, an AND gate 561 responsive to the signal supplied from the other terminal of the transistor 541 and a scrambling activation signal FLG, an AND gate 562 responsive to the output signal of the arithmetic and logic circuit 560 and the scrambling activation signal FLG, and an OR gate 563 responsive to the output signals of the AND gates 561 and 562 and the address bit A0. The output terminal of the OR gate 563 is connected to the address bit output terminal A0'.

The gates of the n-channel transistors 541 5o 548 are connected on the low-potential power line Vss. A Chip Enable signal CE that is low active is applied to each of the gates of the n-channel transistors 550 to 554.

In the circuitry shown in FIG. 29, when the Chip Enable signal CE is high, the n-channel transistors 550 to 554 are all turned on. The potentials at the input terminal of the arithmetic and logic circuit 560 and at the input terminals of the AND gates 561 and 562 become equal to the Vss value (low level). Scrambling therefore does not work.

When the Chip Enable signal CE is low, the transistors 550 to 554 are turned off. A logic signal composed of the address bits A0 to A3 dependent on the on or off states of the n-channel transistors 541 to 548 is fed to each of the arithmetic and logic circuit 560 and the AND gates 561 and 562. At this time, when the scrambling activation signal FLG is driven high, the AND gates 561 and 562 are activated. Consequently, scrambling works.

As mentioned above, in the example of circuitry shown in FIG. 29, the Chip Enable signal CE is used to control the transistors 551 to 554. Thus, an initial value is set in the arithmetic and logic circuit 560. The scrambling activation signal FLG is used to turn on or off the scrambling facility.

Similarly to the example of circuitry shown in FIG. 28, when the n-channel transistors 541 to 548 having the gates thereof connected on the low-potential power line Vss are formed as depletion-type transistors by performing ion implantation, the address signal A0-A3 can be scrambled in any form.

As mentioned above, according to the configuration of the fourth embodiment (See FIGS. 27 to 29), the bits A0 to An of an input address signal can be scrambled in any form. ROM data read from the memory cell array according to scrambled address information is different from correct data that should be read. Thus, similarly to the aforesaid embodiments, illegal copying of data can be substantially disabled.

Figure 30:
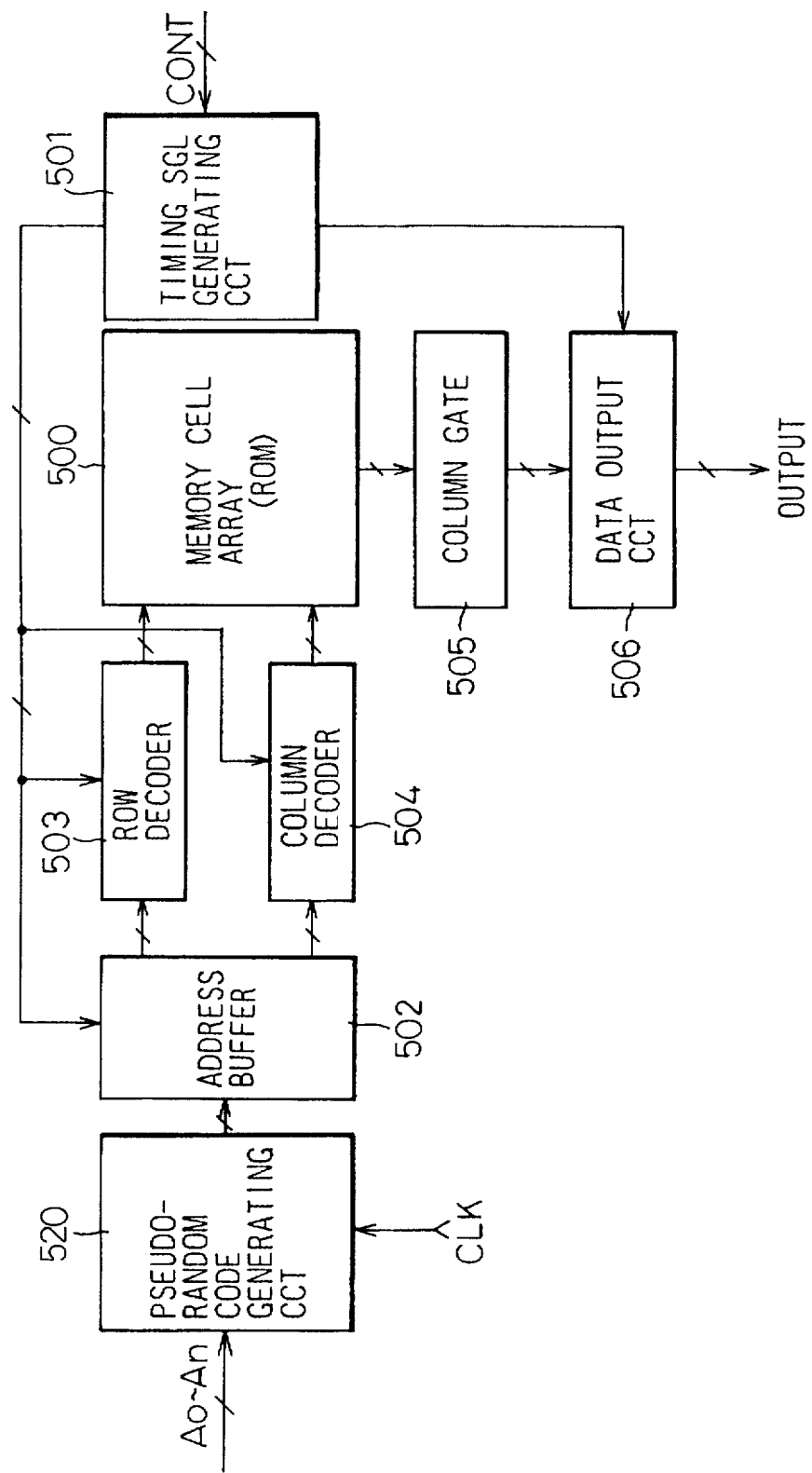
FIG. 30 is a block diagram schematically showing the configuration of a ROM device with a copy-preventive function in accordance with the fifth embodiment of the present invention.

FIG. 30 schematically shows the configuration of a ROM device with a copy-preventive function in accordance with the fifth embodiment of the present invention.

The ROM device of this embodiment is characterized in that a pseudo-random code generating circuit 520 having the same ability as the scrambling circuit 510 is installed in place of the scrambling circuit 510 in the fourth embodiment (See FIG. 27).

In the aforesaid fourth embodiment, a scrambling facility or function is realized by varying the properties of the transistors constituting a scrambling circuit during a manufacturing process. In this embodiment, an equivalent scrambling function is realized by varying the properties of the transistors on the basis of an external control input. In this embodiment, therefore, a clock CLK is used as the external control input. The clock CLK may be supplied externally of the device (that is, a chip) or supplied from any other circuit in the chip.

Figure 31:
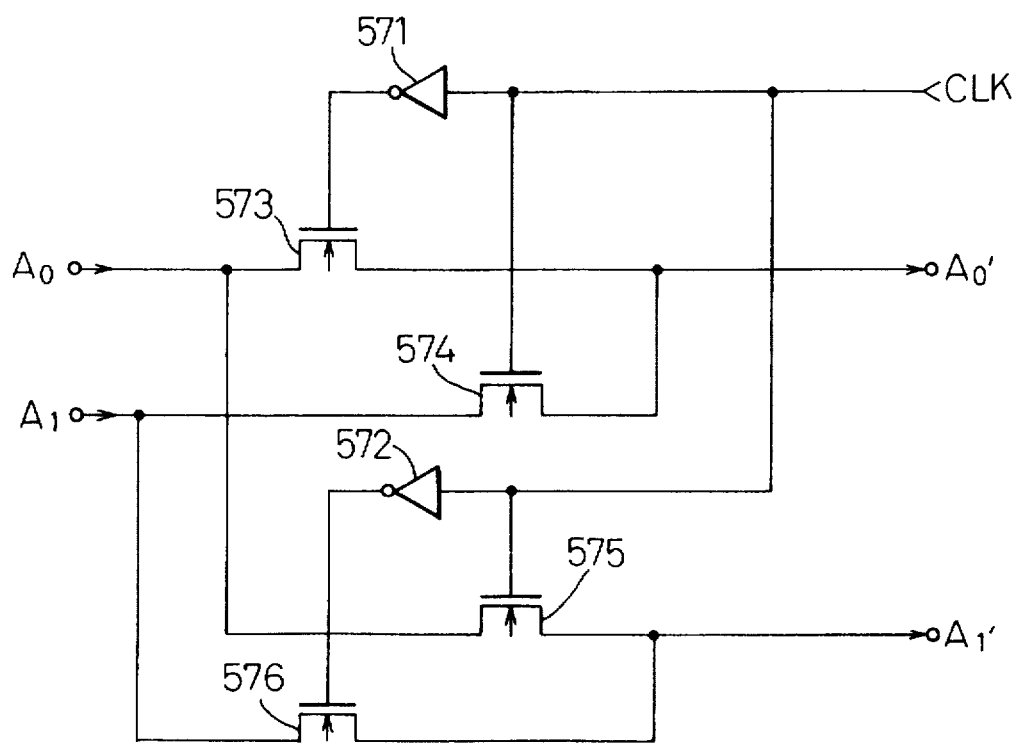
FIG. 31 is a circuit diagram showing an example of circuitry of a pseudo-random code generating circuit shown in FIG. 30.

FIG. 31 shows an example of circuitry of a pseudo-random code generating circuit.

When this example of circuitry is discussed in comparison with the circuitry of a scrambling circuit shown in FIG. 28, n-channel transistors 573 to 576 correspond to the n-channel transistors 531 to 534. Differences in circuitry lie in (1) that inverters 571 and 572 responsive to the clock CLK are installed and (2) that the outputs of the inverters 571 and 572 or the clock CLK is applied to the gates of the transistors 573 to 576.

In the example of circuitry shown in FIG. 31, the externally-supplied clock CLK is used to control the logic levels of the address bits supplied from the output terminals A0' and A1'. Thus, a scrambling facility equivalent to the scrambling circuit shown in FIG. 28 is realized. Specifically, the clock CLK is controlled so that uncertain data (pseudo-random code) will be provided irrespective of input information (address bits A0 and A1) when seen externally of the circuit.

In the illustrated example of circuitry, when the clock CLK is high, the n-channel transistors 574 and 575 are turned on. This causes the outputs of the inverters 571 and 572 to go low. The n-channel transistors 573 and 576 are therefore turned off. As a result, the address bit A1 is supplied from the address bit output terminal A0', and the address bit A0 is supplied from the address bit output terminal A1'. This means that the scrambling facility works. By contrast, when the clock CLK is driven low, the right address bits A0 and A1 are supplied from the address bit output terminals A0' and A1' respectively. The scrambling facility therefore does not work.

As mentioned above, according to the configuration of the fifth embodiment (See FIGS. 30 and 31), the input address signal A0-An can be scrambled on the basis of the external control input (clock CLK). Similarly to the fourth embodiment, illegal copying of data can be substantially disabled.

In the aforesaid fourth and fifth embodiments, the scrambling circuit (or pseudo-random code generating circuit) is situated conveniently enough to act on the input address signal A0-An. The layout of circuit elements is not limited to those in the embodiments. Alternatively, the scrambling (or pseudo-random code generating) facility may be designed to work on data (that is, output information) read from the memory cell array. The scrambling (or pseudo-random code generating) facility may be designed to work on both input information and output information.

Figure 32:
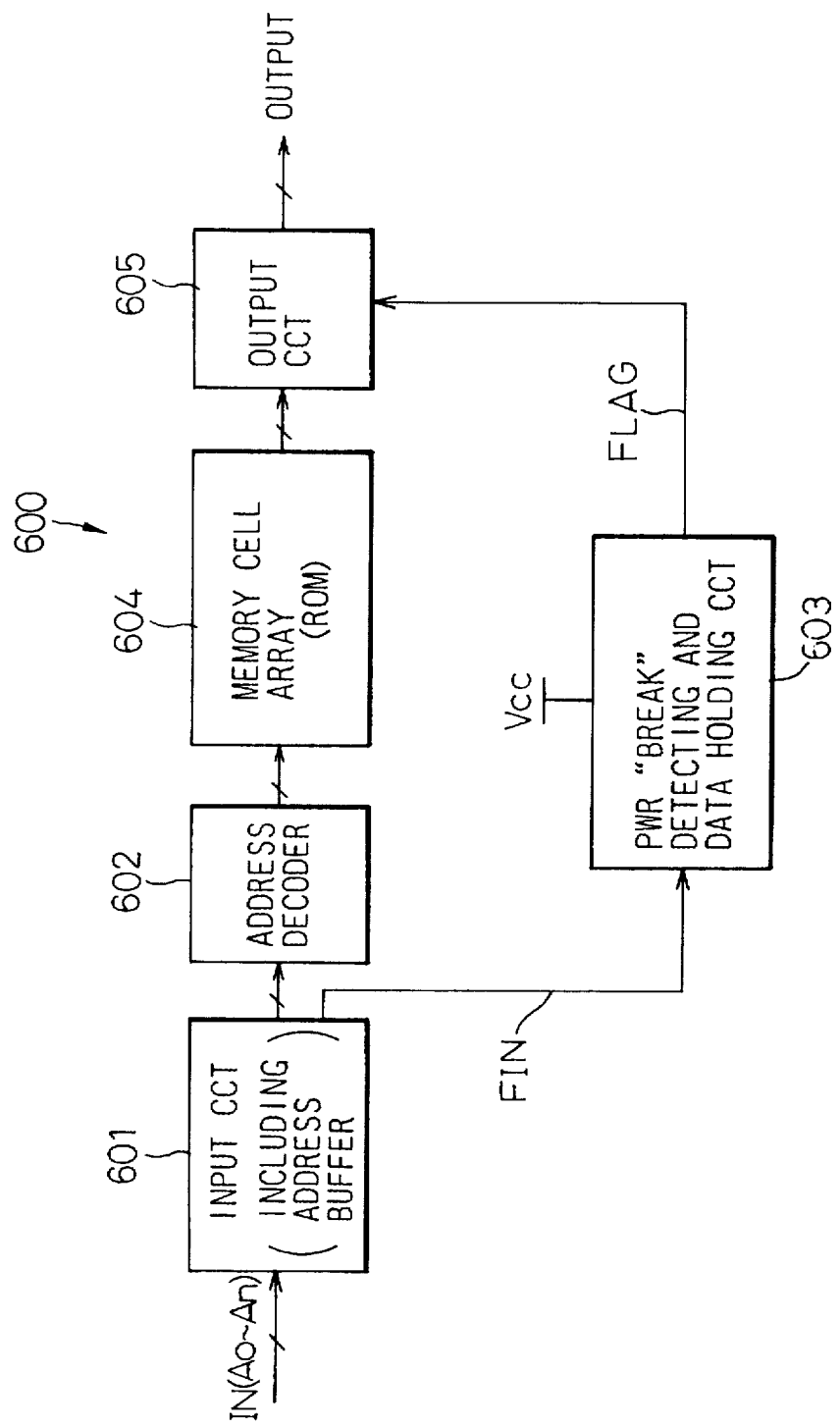
FIG. 32 is a block diagram schematically showing the configuration of a ROM device with a copy-preventive function in accordance with the sixth embodiment of the present invention.

FIG. 32 schematically shows the configuration of a ROM device with a copy-preventive function in accordance with the sixth embodiment of the present invention.

In an illustrated device 600, an address decoder 602, a memory cell array 604, and an output circuit 605 correspond to the circuit elements 102, 104, and 105 in the third embodiment (See FIG. 18). An input circuit 601 has the capability of the address buffer 101 in the third embodiment (See FIG. 18).

The input circuit 601 includes an address buffer responsive to the address signal A0-An that is part of input information IN, and has a facility for giving control according to the data, which is provided as part of the input information, specifying an operation mode (an ordinary function for reading correct ROM data from the memory cell array 604 or a special function for preventing illegal copying of data) for a ROM device so as to instruct whether or not a triggering signal FIN should be provided. In this embodiment, when the data contained in the input information IN specifies the special function, the triggering signal FIN is provided. For the ordinary function, the triggering signal FIN is not provided.

The ROM device of this embodiment is characterized in that a power break detecting and data holding circuit 605 is interposed between the input circuit 601 and output circuit 605 so that when the power supply is broken (supply voltage Vcc becomes 0 V), data retained at that time can be held intact for a given period of time. The output of the power break detecting and data holding circuit 603 is fed as a judgment signal FLAG to the output circuit 605 and used for controlling data output or manipulating data.

Figure 33:
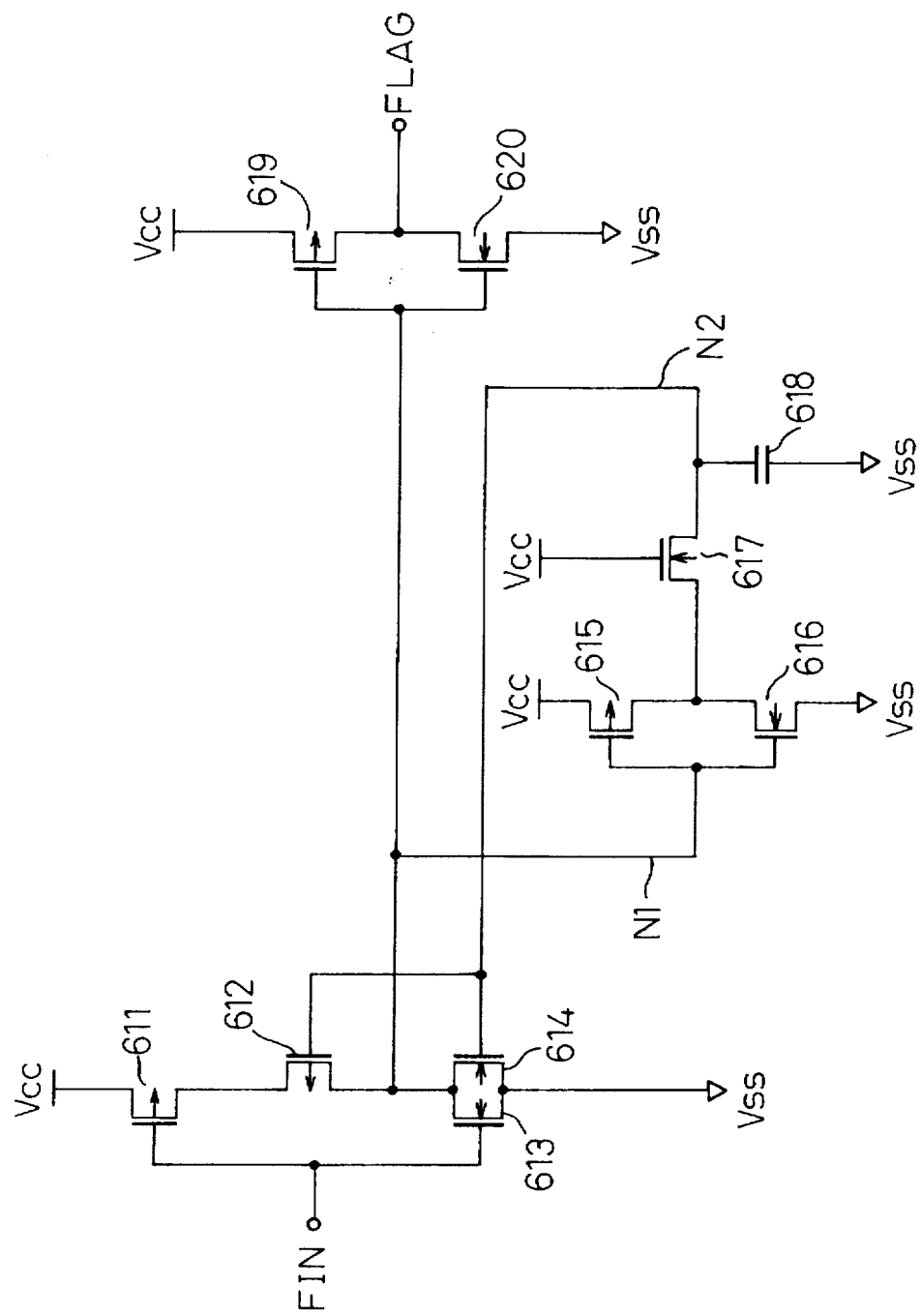
FIG. 33 is a circuit diagram showing an example of circuitry of a power "break" detecting and data holding circuit shown in FIG. 32.

FIG. 33 shows an example of the circuitry of a power break detecting and data holding circuit.

The illustrated circuit comprises p-channel transistors 611 and 612 and an n-channel transistor 613 which are connected in series with one another between a high-potential power line Vcc and a low-potential power line Vss, an n-channel transistor 614 connected in parallel with the n-channel transistor 613, a CMOS inverter (composed of a p-channel transistor 615 and n-channel transistor 616) responsive to a signal supplied from an output terminal (node N1) common to the transistors 612 and 614 constituting a CMOS inverter, an n-channel transistor 617 having the source thereof connected to an output terminal of the CMOS inverter composed of the transistors 615 and 616 and the gate thereof connected on the power line Vcc, a capacitor 618 interposed between the drain of the transistor 617 (node N2 connected to the gates of the transistors 612 and 614) and the power line Vss, and a CMOS inverter (composed of a p-channel transistor 619 and n-channel transistor 620) responsive to the signal supplied from the node N1. The triggering signal FIN is fed to the gates of the transistors 611 and 613 constituting a CMOS inverter. The judgment signal FLAG is supplied from the output terminal of the CMOS inverter composed of the transistors 619 and 620 in the final stage.

Figure 34:
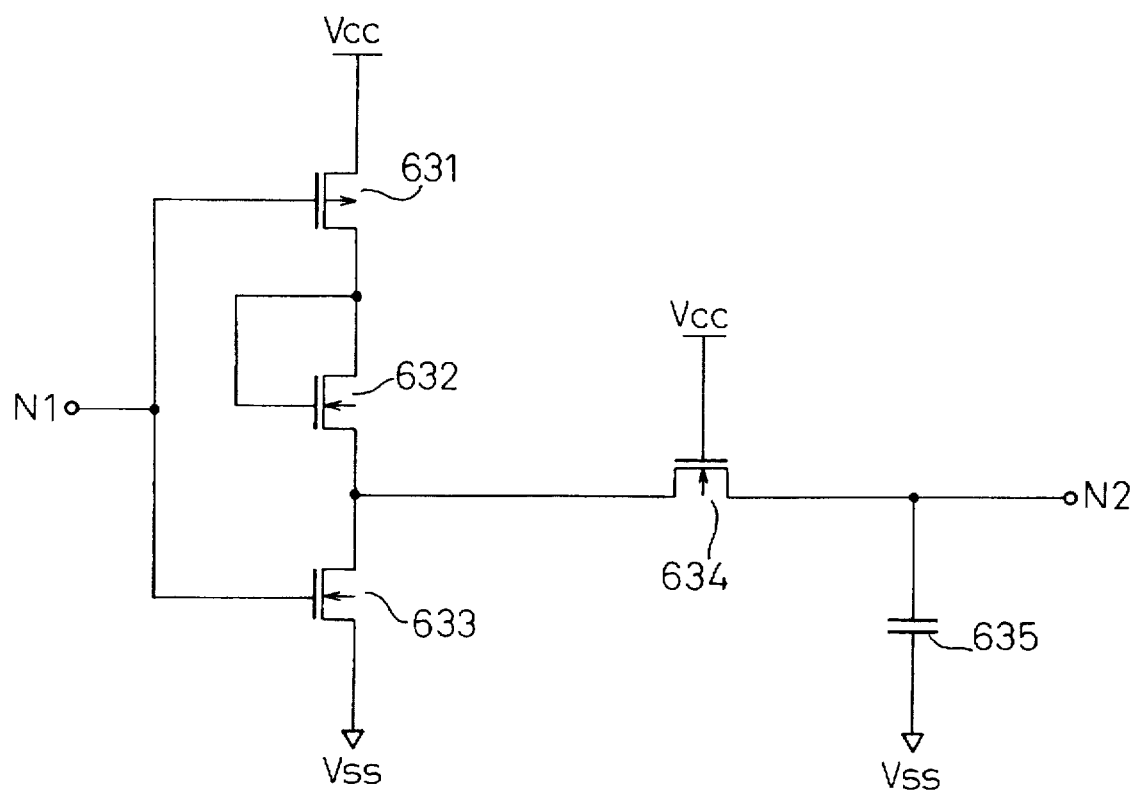
FIG. 34 is a circuit diagram showing the first variant of the major portion of FIG. 33.
Figure 35:
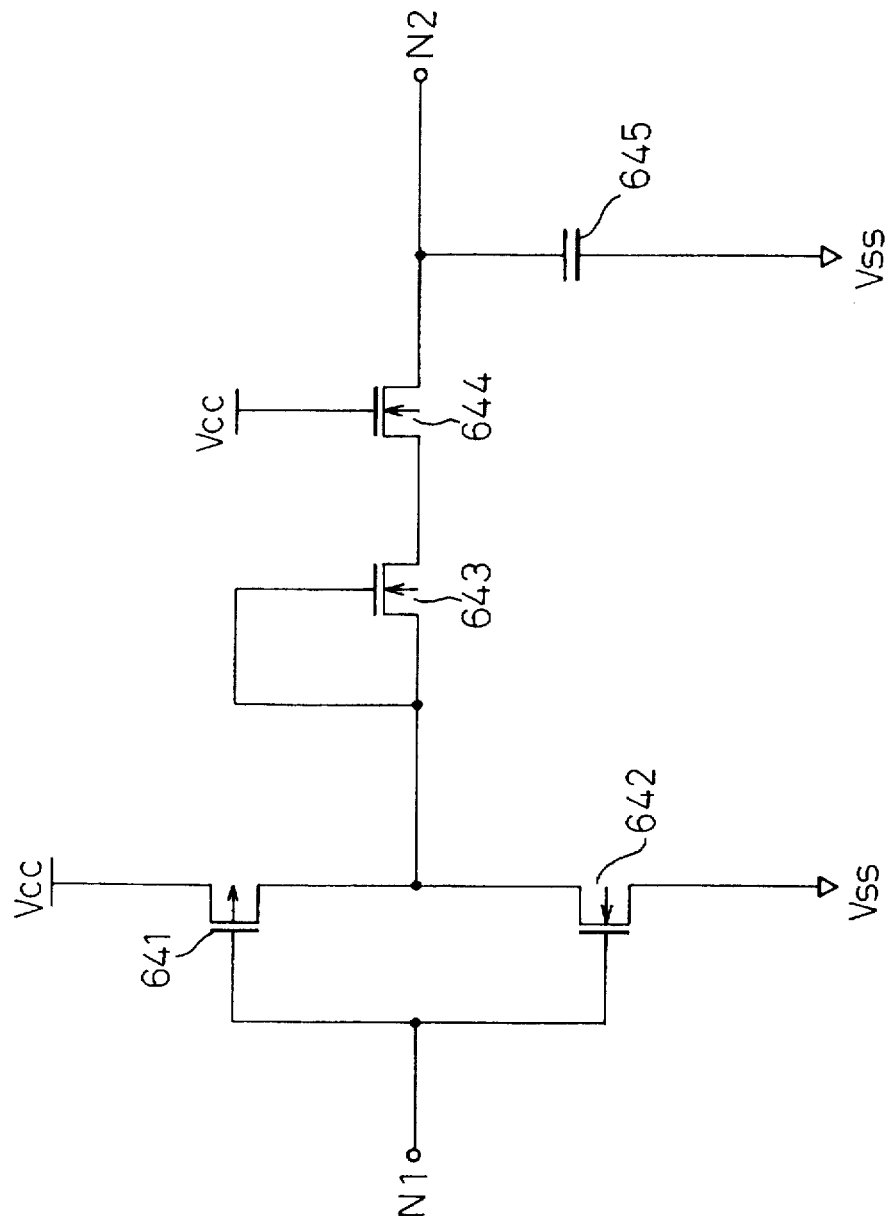
FIG. 35 is a circuit diagram showing the second variant of the major portion of FIG. 33.
Figure 36:
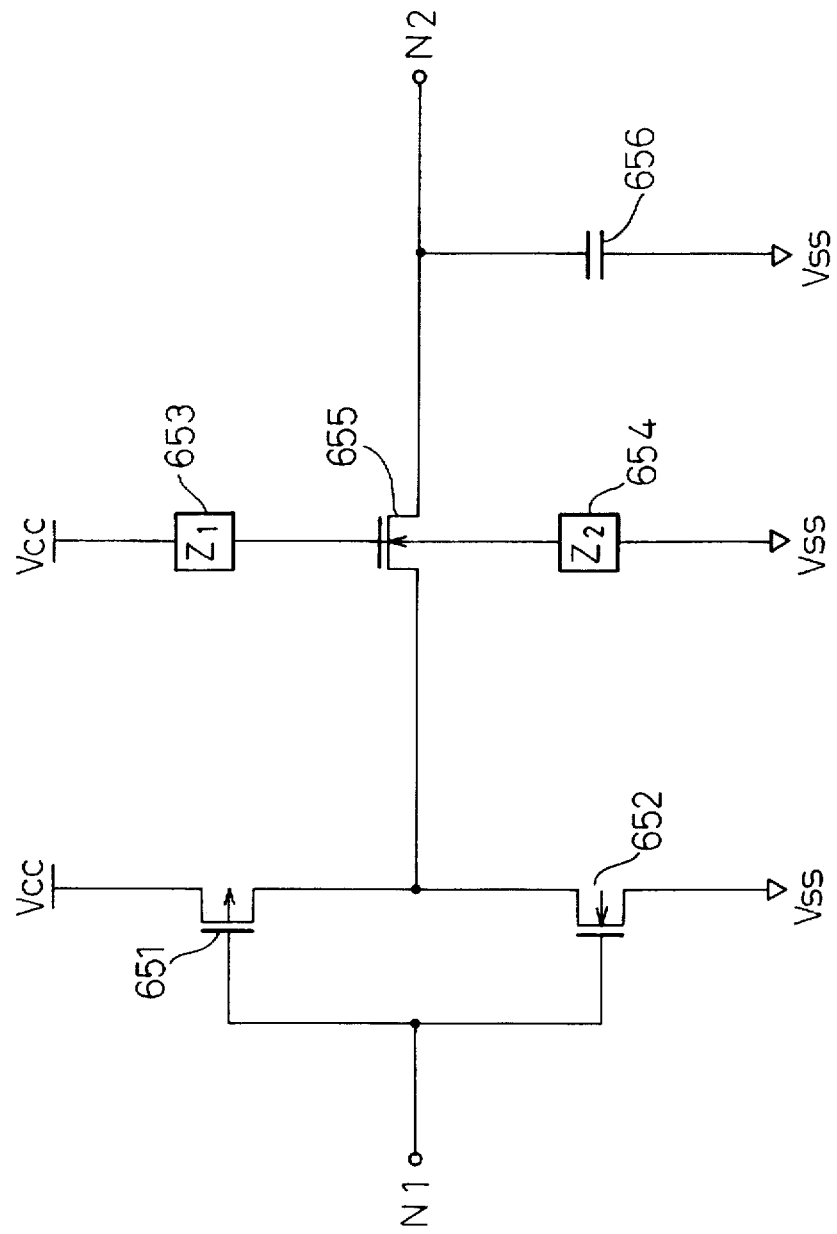
FIG. 36 is a circuit diagram showing the third variant of the major portion of FIG. 33.

FIGS. 34 to 36 show variants of a major portion (circuit elements 615 to 618) of a power break detecting and data holding circuit.

To begin with, when the first variant shown in FIG. 34 is discussed in comparison with the major portion shown in FIG. 33, transistors 631, 633, and 634 correspond to the transistors 615, 616, and 617. A capacitor 635 corresponds to the capacitor 618. The difference from the major portion in FIG. 33 lies in that an n-channel transistor 632 having the gate thereof connected to the drain thereof is interposed between the transistors 631 and 633.

Next, when the second variant shown in FIG. 35 is discussed in comparison with the major portion shown in FIG. 33, transistors 641, 642, and 644 correspond to the transistors 615, 616, and 617. A capacitor 645 corresponds to the capacitor 618. A difference in circuitry from the major portion in FIG. 33 lies in that an n-channel transistor 643 having the gate thereof connected to the source thereof is interposed between the output terminal common to the transistors 641 and 642 and the source of the transistor 644.

Next, when the second variant shown in FIG. 36 is discussed in comparison with the major portion shown in FIG. 33, transistors 651 and 652 correspond to the transistors 615 and 616. A capacitor 656 corresponds to the capacitor 618. Differences in circuitry from the major portion in FIG. 33 lie in (1) that two impedance elements 653 and 654 are connected in series with each other between the power lines Vcc and Vss, and (2) that an n-channel transistor 655 responsive to the potential at the junction between the two impedance elements is interposed between the output terminal common to the transistors 651 and 652 and the node N2.

Next, the operation of a power break detecting and data holding circuit (See FIG. 33) in this embodiment will be described with reference to the waveforms indicating operation timing in FIGS. 37a and 37b.

Figure 37A:
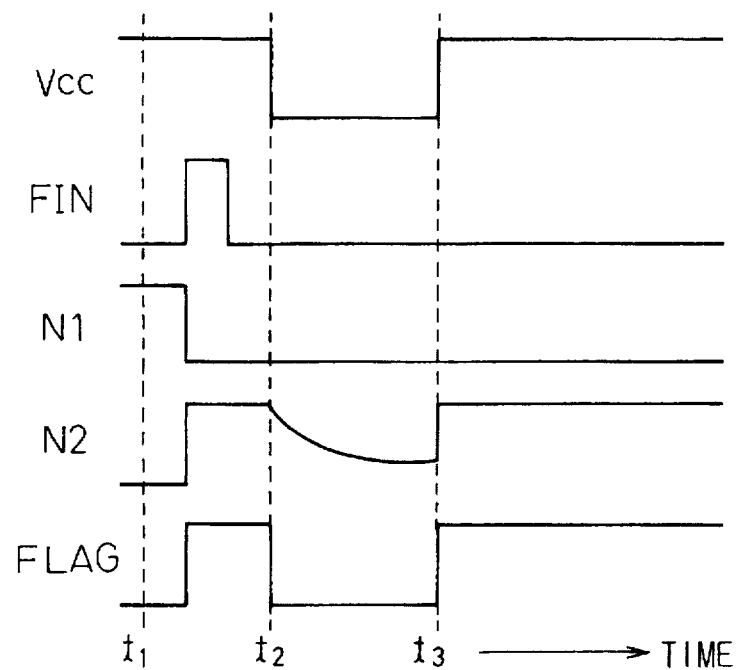
FIGS. 37a and 37b show waveforms indicating operation timing in the circuit shown in FIG. 33.
Figure 37B:
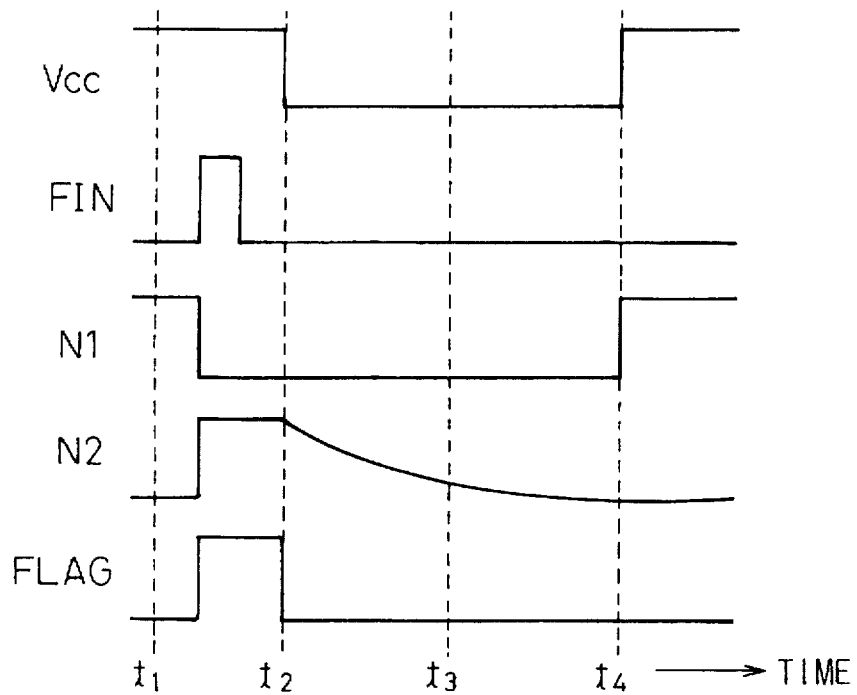

FIG. 37a shows the waveforms indicating operation timing effected when the supply voltage Vcc is raised before the potential at the node N2 (potential at the capacitor 618) is lowered to the Vss value. FIG. 37b shows the waveforms indicating operation timing effected when the supply voltage Vcc is raised after the potential at the node N2 is lowered to the Vss value.

To begin with, when data specifying the special function for preventing illegal copying is contained in input information IN, the triggering signal FIN is supplied in the form of high-level pulses for a duration from a time instant t1 to t2. The transistor 613 is then turned on, causing the potential at the node N1 to go low. The transistor 615 is then turned on. The voltage Vcc is transmitted to the node N2 via the transistor 617. This causes the potential at the capacitor 618 to go high (that is, the capacitor 618 is charged with the voltage Vcc).

When the potential at the node N1 goes low, the transistor 619 in the CMOS inverter in the last stage is turned on. This causes the judgment signal FLAG to go high. Once the judgment signal FLAG goes high, even when the input signal (triggering signal FIN) is driven low, the judgment signal FLAG remains high. This is because when the potential at the node N2 is driven high, the transistor 614 is turned on and the potential at the node N1 is held low (self-hold function).

When data specifying the normal function is contained in the input information IN, the triggering signal FIN is not provided. The judgment signal FLAG is driven low. In this case, correct ROM data is read from the memory cell array 604.

Next, assuming that the power supply is broken at a time instant t2 (the supply voltage Vcc becomes 0 V), the charges accumulated in the capacitor 618 leak out as current flowing in a reverse direction from the drain region (n-type region)

of the n-channel transistor 617 to the substrate (p-type region) thereof. This causes the potential at the node N2 (potential at the capacitor 618) to makes a moderate high-to-low transition. The transition time interval is dependent on a time constant determined with the capacitance of the capacitor 618 and leakage resistance.

When the supply voltage Vcc becomes 0 V (goes low), the judgment signal FLAG is driven low.

Next, assuming that the supply voltage Vcc is raised at a time instant t3 before the potential at the node N2 is lowered to the Vss value (See the waveforms indicating operation timing in FIG. 37a), if the potential at the node N2 exceeds the threshold voltage of the p-channel transistor 612, the transistor 612 is still off. Even if the p-channel transistor 611 is turned on, the potential at the node N1 remains low. In this case, the judgment signal FLAG is driven high at the time instant t3.

When the supply voltage Vcc is raised at a time instant t4 after the potential at the node N2 is lowered to the Vss value (See the waveforms indicating operation timing in FIG. 37b), the p-channel transistor 612 is turned on. This causes the potential at the node N1 to go high. The transistor 620 in the CMOS inverter in the last stage is then turned on. The judgment signal FLAG therefore remains low.

Even after the power supply is broken, if the power break period is within a certain value, the judgment signal FLAG remains high but does not make a transition. High-level data is retained in the capacitor 618.

In other words, when data specifying the special function for preventing illegal copying is contained in input information IN, the data is fed as a high-level triggering signal FIN to a power break detecting and data holding circuit and retained there. Thereafter, even if the power supply is broken, as long as the power break period is within a certain value, the data specifying the special function is retained with the high level unchanged.

As mentioned above, according to the configuration of the sixth embodiment (See FIGS. 32 to 37b), even if the power supply is broken accidentally, as long as the power supply can be made within a certain period of time, the data specifying the special function for preventing illegal copy can be retained reliably. Based on the retained data, illegal copying of data can be substantially disabled.

What is claimed is:

1. A semiconductor integrated circuit device with a copy-preventive function, comprising:

a memorizing means for storing data to be used by users;

an inputting means for performing various logical operations on at least one input information fed externally and accessing said memorizing means;

an outputting means for performing various logical operations on said data at the time of supplying said data from said memorizing means;

a judging means for comparing at least one of the states of said input information, the logical state of said inputting means, the logical state of said outputting means, and the state of data supplied from said outputting means with specific judgement information, and for outputting a signal indicating the result of comparison; and a controlling means that when the result indicated by said judging means reveals that said at least one of the states is consistent with a specific state, outputting a signal which acts on said outputting means so as to prevent data stored in said memorizing means from being supplied normally.

2. The device according to claim 1, wherein said semiconductor integrated circuit device is realized as a masked ROM in which said data to be used by users is fixed in said memorizing means through wafer fabrication for forming a semiconductor integrated circuit.

3. The device according to claim 2, wherein said semiconductor integrated circuit device is realized as a ROM enabling users to write or rewrite data to be used by users.

4. The device according to claim 2, wherein respective functions of said judging means and said controlling means are variably realized using a means equivalent to the process of fixing data in said memorizing means through wafer fabrication for forming a semiconductor integrated circuit.

5. The device according to claim 4, wherein said means equivalent to the process of locking data in said memorizing means is realized as ion implantation, metallic connection, or polysilicon connection that is employed in wafer fabrication for forming a semiconductor integrated circuit.

6. The device according to claim 2, further comprising a holding means for holding a judgment of said judging means meaning that said at least one of the states is consistent with said specific state.

7. The device according to claim 6, wherein said holding means includes a bistable multivibrator for retaining said judgment of said judging means at at least one of input/output nodes.

8. The device according to claim 6, wherein when the power supply for applying a supply voltage to said semiconductor integrated circuit device is turned off, said holding means retains a judgment meaning that said at least one of the states is consistent with said specific state for a given period of time after the power supply is turned off.

9. The device according to claim 8, wherein said holding means includes a bistable multivibrator, for retaining a judgment of said judging means at at least one of input/output nodes, and a capacitor connected to one of said input/output nodes.

10. The device according to claim 8, wherein said holding means includes a bistable multivibrator for retaining a judgment of said judging means at at least one of input/output nodes, a capacitor connected to one of said input/output nodes, an internal power line for applying a supply voltage to said bistable multivibrator, a transmitting element for transmitting a supply voltage to be applied to said semiconductor integrated circuit device over said internal power line, and a capacitor connected to the output terminal of said transmitting element.

11. The device according to claim 9, wherein said capacitors are MOS capacitors produced through wafer fabrication for forming a semiconductor integrated circuit.

12. The device according to claim 8, wherein when said semiconductor integrated circuit device assumes the form of a masked ROM, said given period of time is set to be variable by a means equivalent to the process of fixing data in said memorizing means through wafer fabrication for forming a semiconductor integrated circuit.

13. The device according to claim 12, wherein said means equivalent to the process of locking data in said memorizing means is realized as ion implantation, metallic connection, or polysilicon connection that is employed in wafer fabrication for forming a semiconductor integrated circuit.

14. The device according to claim 6, wherein said holding means includes an irreversible element whose state cannot be returned to the original one; such as, a fuse element.

15. The device according to claim 2, wherein said controlling means includes means that when said judging means judges that said at least one of the states is consistent with said specific state, disables read-out of data stored in said memorizing means.

16. The device according to claim 15, wherein said means for disabling read-out of data includes an oscillator circuit.

17. The device according to claim 2, wherein said controlling means includes means such that, when said judging means judges that said at least one of the states is consistent with said specific state, manipulates logic levels so that said data stored in said memorizing means will be different from correct data to be supplied from said outputting means, and then provides resultant data.

18. The device according to claim 2, further comprising a memory means for storing specific judgment information, wherein said specific judgment information is fixed in said memory means through wafer fabrication for forming a semiconductor integrated circuit.

19. The device according to claim 13, further comprising a memory means for storing specific judgment information, wherein said specific judgment information is varied in said memory means by users when needed.

20. A semiconductor integrated circuit device with a copy-preventive function, comprising:

a memorizing means for storing data to be used by users;

an inputting means for performing various logical operations on at least one input information fed externally and accessing said memorizing means;

an outputting means for performing various logical operations on said data at the time of supplying said data from said memorizing means;

a detecting/memorizing means for referencing information concerning a plurality of specific address regions containing addresses associated with data items existent in said memorizing means, for detecting if any of said plurality of specific address regions is accessed in response to said input information, and for storing the access situation; and a data manipulating means for checking said stored access situation for condition judgment, and controlling said outputting means so as to manipulate the contents of data to be supplied from said memorizing means.

21. The device according to claim 20, wherein said detecting/memorizing means stores the number of consecutive accesses gained to a specific one of said plurality of specific address regions in response to said input information, and said data manipulating means gives control so as to manipulate the contents of output data according to said stored number of accesses.

22. The device according to claim 21, wherein said data manipulating means gives control so as to manipulate the contents of output data depending on whether the number of accesses gained to a specific region which is stored in said detecting/memorizing means.

23. The device according to claim 20, further comprising a memory means for storing information concerning said plurality of specific address regions, wherein said information concerning said plurality of specific address regions is fixed in said memory means through wafer fabrication for forming a semiconductor integrated circuit.

24. The device according to claim 20, further comprising a memory means for storing information concerning said plurality of specific address regions, wherein said information concerning said plurality of specific address regions is varied in said memory means by users when needed.

25. A semiconductor integrated circuit device with a copy-preventive function, comprising:

a memorizing means for storing data to be used by users;

an inputting means for performing various logical operations on at least one input information fed externally and accessing said memorizing means;

an outputting means for performing various logical operations on said data at the time of supplying said data from said memorizing means; and a secret code memorizing and coincidence detecting circuit for comparing input information fed by said inputting means with specific secret code information and supplying a consistency-or-inconsistency detected signal dependent on the result of comparison;

said secret code memorizing and coincidence detecting circuit including a bit serial circuit that supplies a consistency detected signal through one terminal thereof, has the other terminal thereof connected to a first power line, and includes a plurality of basic circuits connected in series with one another, and a load means that is interposed between said one terminal of said bit serial circuit and a second power supply line, and has a higher potential difference between terminals when said bit serial circuit is on than when said bit serial circuit is off;

said plurality of basic circuits each having both terminals thereof turned on when a signal representing input information fed through a control input terminal has a first logic level and turned on or off in the same manner as a nonvolatile memory when said signal has the opposite of said first logic level.

26. The device according to claim 25, wherein a plurality of said bit serial circuits are connected in parallel with one another.

27. The device according to claim 25, wherein said plurality of basic circuits each includes a first FET that is turned on when a gate potential thereof is one of high and low and turned off or on when said gate potential is the other of high and low, and a second FET that is connected in series with said first FET, that receives a potential, of which level is opposite to that of said gate potential of said first FET, through a gate thereof, and that is turned on when a gate potential thereof is one of high and low and turned on or off when said gate potential is the other of high and low.

28. The device according to claim 25, wherein said plurality of basic circuits each includes a first FET that is turned on when a gate potential thereof is one of high and low and turned off or on when said gate potential is the other of high and low, and a second FET that is connected in parallel with said first FET, that receives a potential, of which level is opposite to that of said gate potential of said first FET, through a gate thereof, and that is turned on when a gate potential thereof is either of high and low and turned on or off when said gate potential is the other of high and low, and wherein said first FET and second FET are not turned off simultaneously.

29. The device according to claim 27, wherein said first FET or second FET that is turned on irrespective of whether said gate potential is high or low is of the depletion type in which the threshold voltage is lower than said low level.

30. The device according to claim 30, wherein said first FET or second FET that is turned on irrespective of whether said gate potential is high or low has a source and drain thereof strapped.

31. The device according to claim 28, wherein said first FET or second FET that is turned off irrespective of whether said gate potential is high or low has a threshold voltage higher than said high level.

32. The device according to claim 28, wherein said first FET or second FET that is turned off irrespective of whether said gate potential is high or low has a source or drain thereof floated.

33. A semiconductor integrated circuit device with a copy-preventive function, comprising:

a memorizing means for storing data to be used by users;

an inputting means for performing various logical operations on at least one input information fed externally and accessing said memorizing means;

an outputting means for performing various logical operations on said data at the time of supplying said data from said memorizing means; and a secret code memorizing and coincidence detecting circuit for comparing input information fed by said inputting means with given secret code information, and supplying a Consistency-or-inconsistency Detected signal dependent on the result of comparison to said outputting means;

said secret code memorizing and coincidence detecting circuit including a bit parallel circuit that supplies a Consistency Detected signal through one terminal thereof, has the other terminal thereof connected to a first power line, includes a plurality of basic circuits connected in parallel with one another, and a load means that is interposed between one terminal of said bit parallel circuit and a second power supply line, and has a higher potential difference between terminals when said bit parallel circuit is on than when said bit parallel circuit is off; and said plurality of basic circuits each having both terminals thereof turned off when a signal representing input information fed through a control input terminal has a first logic level and turned on or off in the same manner as a nonvolatile memory when said signal is the opposite of said first logic level.

34. The device according to claim 33, wherein said plurality of basic circuits each includes a first FET that is turned on when a gate potential thereof is one of high and low and turned off or on when said gate potential is the other of high and low, and a second FET that is connected in series with said first FET, that receives a potential, of which level is opposite to that of said gate potential of said first FET, through a gate thereof, and that is turned on when a gate potential thereof is one of high and low and turned off or on when said gate potential is the other of high and low, and wherein said first FET and second FET are not turned on simultaneously.

35. The device according to claim 33, wherein said plurality of basic circuits each includes a first FET that is turned on when a gate potential thereof is one of high and low and turned on or off when said gate potential is the other of high and low, and a second FET that is connected in series with said first FET, that receives a potential, of which level is opposite to that of said gate potential of said first FET, through a gate thereof, and that is turned off when a gate potential thereof is one of high and low and turned on or off when said gate potential is the other of high and low.

36. The device according to claim 34, wherein said first FET or second FET that is turned on irrespective of whether said gate potential is high or low is of the depletion type in which the threshold voltage is lower than said low level.

37. The device according to claim 34, wherein said first FET or second FET that is turned on irrespective of whether said gate potential is high or low has a source and drain thereof strapped.

38. The device according to claim 35, wherein said first FET or second FET that is turned off irrespective of whether said gate potential is high or low has a threshold voltage higher than said high level.

39. The device according to claim 35, wherein said first FET or second FET that is turned off irrespective of whether said gate potential is high or low has a source and drain thereof floated.

40. A semiconductor integrated circuit device with a copy-preventive function, comprising:

a memorizing means for storing data to be used by users;

an inputting means for performing various logical operations on at least one input information fed externally and accessing said memorizing means;

an outputting means for performing various logical operations on said data at the time of supplying said data from said memorizing means; and a scrambling means for scrambling the logical state of a signal representing at least one of said input information and data provided by said outputting means.

41. The device according to claim 40, wherein a signal output by said scrambling means is produced through ion implantation employed in wafer fabrication for forming a semiconductor integrated circuit.

42. The device according to claim 41, wherein said scrambling means includes a plurality of transistors whose on or off states are pre-fixed in a manufacturing process, and at least one of said plurality of transistors is formed as a depletion-type transistor through said ion implantation.

43. The device according to claim 40, wherein said scrambling means includes a plurality of transistors and a means for varying the on or off states of said plurality of transistors according to a specific control signal.

44. A semiconductor integrated circuit device with a copy-preventive function, comprising:

a memorizing means for storing data to be used by users;

an inputting means for performing various logical operations on at least input information fed externally and accessing said memorizing means;

an outputting means for performing various logical operations on said data at the time of supplying said data from said memorizing means; and a data holding means for receiving supply voltage and temporarily storing at least one of the state of said input information, the logical state of said inputting means, the logical state of said outputting means, and the state of data provided by said outputting means;

said data holding means keeping retaining state data, which is held when said supply voltage is broken, for a given period of time.

45. The device according to claim 44, wherein when input information fed by said inputting means contains data indicating a special function for preventing illegal copying, said data holding means retains said data for said given period of time after said supply voltage is broken, and controls said outputting means according to said retained data.

46. The device according to claim 45, wherein said data holding means includes a capacitor, and said given period of time is dependent on the capacitance of said capacitor.

47. The device according to claim 44, wherein said data holding means is installed separately from said memorizing means.

48. A semiconductor integrated circuit device with a copy-preventive function, comprising:

a memorizing unit for storing data to be used by users;

an inputting unit for performing various logical operations on at least one input information fed externally and accessing said memorizing unit;

an outputting unit for performing various logical operations on said data at the time of supplying said data from said memorizing unit;

a judging unit for comparing at least one of the states of said input information, the logical state of said inputting unit, the logical state of said outputting unit, and the state of data supplied from said outputting unit with specific judgement information, and for outputting a signal indicating the result of comparison; and a controlling unit that when the result indicated by said judging unit reveals that said at least one of the states is consistent with a specific state, outputting a signal which acts on said outputting unit so as to prevent data stored in said memorizing unit from being supplied normally.

49. A semiconductor integrated circuit device with a copy-preventive function, comprising:

a memorizing unit for storing data to be used by users;

an inputting unit for performing various logical operations on at least one input information fed externally and accessing said memorizing unit;

an outputting unit for performing various logical operations on said data at the time of supplying said data from said memorizing unit;

a detecting/memorizing unit for referencing information concerning a plurality of specific address regions containing addresses associated with data items existent in said memorizing means, for detecting if any of said plurality of specific address regions is accessed in response to said input information, and for storing the access situation; and a data manipulating unit for checking said stored access situation for condition judgement, and controlling said outputting unit so as to manipulate the contents of data to be supplied from said memorizing unit.

50. A semiconductor integrated circuit device with a copy-preventive function, comprising:

a memorizing unit for storing data to be used by users;

an inputting unit for performing various logical operations on at least one input information fed externally and accessing said memorizing unit;

an outputting unit for performing various logical operations on said data at the time of supplying said data from said memorizing unit; and a secret code memorizing and coincidence detecting circuit for comparing input information fed by said inputting unit with specific secret code information and supplying a consistency-or-inconsistency detected signal dependent on the result of comparison;

said secret code memorizing and coincidence detecting circuit including a bit serial circuit that supplies a consistency detected signal through one terminal thereof, has the other terminal thereof connected to a first power line, and includes a plurality of basic circuits connected in series with one another, and a load unit that is interposed between said one terminal of said bit serial circuit and a second power supply line, and has a higher potential difference between terminals when said bit serial circuit is on than when said bit serial circuit is off;

said plurality of basic circuits each having both terminals thereof turned on when a signal representing input information fed through a control input terminal has a first logic level and turned on or off in the same manner as a nonvolatile memory when said signal has the opposite of said first logic level.

51. A semiconductor integrated circuit device with a copy-preventive function, comprising:

a memorizing unit for storing data to be used by users;

an inputting unit for performing various logical operations on at least one input information fed externally and accessing said memorizing unit;

an outputting unit for performing various logical operations on said data at the time of supplying said data from said memorizing unit; and a secret code memorizing and coincidence detecting circuit for comparing input information fed by said inputting unit with given secret code information, and supplying a Consistency-or-inconsistency Detected signal dependent on the result of comparison to said outputting unit;

said secret code memorizing and coincidence detecting circuit including a bit parallel circuit that supplies a Consistency Detected signal through one terminal thereof, has the other terminal thereof connected to a first power line, includes a plurality of basic circuits connected in parallel with one another, and a load unit that is interposed between one terminal of said bit parallel circuit and a second power supply line, and has a higher potential difference between terminals when said bit parallel circuit is on than when said bit parallel circuit is off; and said plurality of basic circuits each having both terminals thereof turned off when a signal representing input information fed through a control input terminal has a first logic level and a turned on or off in the same manner as a nonvolatile memory when said signal is the opposite of said first logic level.

52. A semiconductor integrated circuit device with a copy-preventive function, comprising:

a memorizing unit for storing data to be used by users;

an inputting unit for performing various logical operations on at least one input information fed externally and accessing said memorizing unit;

an outputting unit for performing various logical operations on said data at the time of supplying said data from said memorizing unit; and a scrambling unit for scrambling the logical state of a signal representing at least one of said input information and data provided by said outputting unit.

53. A semiconductor integrated circuit device with a copy-preventive function, comprising:

a memorizing unit for storing data to be used by users;

an inputting unit for performing various logical operations on at least input information fed externally and accessing said memorizing unit;

an outputting unit for performing various logical operations on said data at the time of supplying said data from said memorizing unit; and a data holding unit for receiving supply voltage and temporarily storing at least one of the state of said input information, the logical state of said inputting unit, the logical state of said outputting unit, and the state of data provided by said outputting unit;

said data holding unit keeping retaining state data, which is held when said supply voltage is broken, for a given period of time.

* * * * *